US010447889B2

(12) United States Patent
Suzuki

(10) Patent No.: US 10,447,889 B2
(45) Date of Patent: Oct. 15, 2019

(54) IMAGE READING APPARATUS AND IMAGE SENSOR MODULE TO SUPPRESS EXCESSIVE POWER CONSUMPTION OR EXCESSIVE NOISE

(71) Applicant: SEIKO EPSON CORPORATION, Tokyo (JP)

(72) Inventor: Takafumi Suzuki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 74 days.

(21) Appl. No.: 15/713,886

(22) Filed: Sep. 25, 2017

(65) Prior Publication Data

US 2018/0091695 A1    Mar. 29, 2018

(30) Foreign Application Priority Data

Sep. 29, 2016   (JP) ................................ 2016-190809

(51) Int. Cl.
| H04N 1/40 | (2006.01) |
| H01L 27/146 | (2006.01) |
| H04N 1/00 | (2006.01) |
| H04N 1/19 | (2006.01) |
| H04N 1/028 | (2006.01) |

(52) U.S. Cl.
CPC ... *H04N 1/40056* (2013.01); *H01L 27/14612* (2013.01); *H01L 27/14625* (2013.01); *H01L 27/14689* (2013.01); *H04N 1/00519* (2013.01); *H04N 1/00994* (2013.01); *H04N 1/02835* (2013.01); *H04N 1/19* (2013.01)

(58) Field of Classification Search
None
See application file for complete search history.

(56) References Cited

U.S. PATENT DOCUMENTS

| 4,939,578 A | 7/1990 | Kano |
| 7,710,169 B2 | 5/2010 | Tanaka |
| 8,537,407 B2 | 9/2013 | Okamoto |
| 2009/0303362 A1* | 12/2009 | Ebihara ................. H04N 5/353 348/296 |
| 2010/0123939 A1 | 5/2010 | Tsai |
| 2013/0235675 A1 | 9/2013 | Cho |

(Continued)

FOREIGN PATENT DOCUMENTS

| JP | 2006-314039 A | 11/2006 |
| JP | 2008-125061 A | 5/2008 |
| JP | 2011-091698 A | 5/2011 |

OTHER PUBLICATIONS

Feb. 6, 2019 Office Action issued in U.S. Appl. No. 15/714,143.

*Primary Examiner* — Andrew H Lam
(74) *Attorney, Agent, or Firm* — Oliff PLC

(57) ABSTRACT

An image sensor module includes a first image reading chip and a second image reading chip. A first output circuit of the first image reading chip performs driving with multiple drive capabilities. A first output selection unit selects a first drive capability from the multiple drive capabilities and supplies a selection signal to the first output circuit. A second output circuit of the second image reading chip performs driving with one of the multiple drive capabilities. A second output selection unit selects a second drive capability from the multiple drive capabilities and supplies a selection signal to the second output circuit.

11 Claims, 17 Drawing Sheets

(56) References Cited

U.S. PATENT DOCUMENTS

2015/0103083 A1* 4/2015 Obinata ............... G09G 3/2096
                                                            345/520
2016/0198110 A1* 7/2016 Ikedo .................... H04N 5/378
                                                         348/231.99

* cited by examiner

| OEA | OEB | OE1 | OE2 |
|-----|-----|-----|-----|
| L   | L   | L   | L   |
| H   | L   | H   | L   |
| L   | H   | H   | H   |

FIG. 12

IMAGE READING APPARATUS AND IMAGE SENSOR MODULE TO SUPPRESS EXCESSIVE POWER CONSUMPTION OR EXCESSIVE NOISE

BACKGROUND

1. Technical Field

The present invention relates to an image reading apparatus and an image sensor module.

2. Related Art

JP-A-2006-314039 discloses an image reading apparatus (scanner) that reads an original image using an image scanner, converts the image signal obtained by reading into digital image data using an analog front end (AFE), and outputs the converted digital image data to a digital processing unit or a data transfer unit.

JP-A-2006-314039 is an example of related art.

Since various types of scanners such as sheet-feeding and flat-feeding scanners exist and the arrangement of the image sensor and the analog front end (AFE) differs according to the type of the scanner, the length of a wire by which the image signal output from the image sensor is transferred (load capacity of image signal) differs for each scanner. For this reason, heretofore, a general-purpose image sensor that can be applied to various types of scanners has high drive capability, which is needed to drive an envisioned maximum load.

However, since the driving load of the image sensor is relatively small depending on the arrangement relationship of the image sensor and the analog front end (AFE), there are also cases where the drive capability of the image sensor is excessive, and thus there has been a risk that excessive power consumption will occur, and excessive noise accompanying signal transfer will occur.

SUMMARY

According to several aspects of the invention, it is possible to provide an image reading apparatus and an image sensor module according to which it is possible to suppress the occurrence of excessive power consumption and excessive noise accompanying signal transfer.

The invention was made to solve at least a portion of the foregoing problems, and can be realized as the following aspects or application examples.

Application Example 1

An image reading apparatus according to the present application example includes: an image sensor module that includes a first image reading chip and a second image reading chip and is configured to read an image; a first reception unit; and a second reception unit, wherein the first image reading chip includes: a first pixel portion that is configured to output a first pixel signal and includes a first light-receiving element that receives and photoelectrically converts light from the image; a first output circuit that can output a signal based on the first pixel signal with one of a plurality of drive capabilities including a first drive capability and a second drive capability that is larger than the first drive capability; and a first output selection unit configured to select a drive capability of the first output circuit from the plurality of drive capabilities, the second image reading chip includes: a second pixel portion that is configured to output a second pixel signal and includes a second light-receiving element that receives and photoelectrically converts light from the image; a second output circuit that can output a signal based on the second pixel signal with one of a plurality of drive capabilities including a third drive capability; and a second output selection unit configured to select a drive capability of the second output circuit from the plurality of drive capabilities, the first reception unit receives the signal output from the first output circuit, the second reception unit receives the signal output from the second output circuit, and the output selection unit selects the first drive capability.

With the image reading apparatus according to the present application example, in the first image reading chip, the drive capability of the first output circuit is set to the first drive capability (drive capability that is not the largest), which is smaller than the second drive capability, such that the drive capability matches the size of the load of the transfer wire for the output signal and does not become excessive, and in the second image reading chip, the drive capability of the second output circuit can be set appropriately such that the drive capability matches the size of the load of the transfer wire for the output signal and does not become excessive, and therefore it is possible to suppress the occurrence of excessive power consumption and excessive noise accompanying signal transfer.

Also, with the image reading apparatus according to the present application example, the output signal from the first image reading chip is transferred to the first reception unit and the output signal from the second image reading chip is transferred to the second reception unit, and therefore the transfer of the output signal from the first image reading chip and the transfer of the output signal from the second image reading chip can be performed in parallel, which makes it possible to increase the speed of reading an image.

Application Example 2

With the image reading apparatus according to the above-described application example, the plurality of drive capabilities of the second output circuit may include a fourth drive capability that is larger than the third drive capability, and the second output selection unit may select the third drive capability.

With the image reading apparatus according to the present application example, in the second image reading chip, the drive capability of the second output circuit is set to the third drive capability (drive capability that is not the largest), which is smaller than the fourth drive capability, such that the drive capability matches the size of the load of the transfer wire for the output signal and does not become excessive, and therefore it is possible to suppress the occurrence of excessive power consumption and excessive noise accompanying signal transfer.

Application Example 3

With the image reading apparatus according to the above-described application example, the image sensor module may include: a first image reading chip group comprising a plurality of image reading chips including the first image reading chip; and a second image reading chip group comprising a plurality of image reading chips including the second image reading chip, the plurality of image reading chips included in the first image reading chip group may each include: the first pixel portion; the first output circuit;

and the first output selection unit, the plurality of image reading chips included in the second image reading chip group may each include: the second pixel portion; the second output circuit; and the second output selection unit, the first reception unit may sequentially receive signals output from the first output circuits of the plurality of image reading chips included in the first image reading chip group, and the second reception unit may sequentially receive signals output from the second output circuits of the plurality of image reading chips included in the second image reading chip group.

With the image reading apparatus according to the present application example, in the plurality of image reading chips included in the first image reading chip group, the drive capability of the first output circuits can be set appropriately such that the drive capability matches the size of the load of the transfer ire for the output signals and does not become excessive, and in the plurality of image reading chips included in the second image reading chip group, the drive capability of the second output circuits can be set appropriately such that the drive capability matches the size of the load of the transfer wire for the output signals and does not become excessive, and therefore it is possible to suppress the occurrence of excessive power consumption and excessive noise accompanying signal transfer.

Also, with the image reading apparatus according to the present application example, the output signals from the plurality of image reading chips included in the first image reading chip group are sequentially transferred to the first reception unit and the output signals from the plurality of image reading chips included in the second image reading chip group are sequentially transmitted to the second reception unit, and therefore the transfer of the output signals from the plurality of image reading chips included in the first image reading chip group and the transfer of the output signals from the plurality of image reading chips included in the second image reading chip group can be performed in parallel, and therefore it is possible to increase the speed of reading the image.

Application Example 4

With the image reading apparatus according to the above-described application example, the first output selection units of the plurality of image reading chips included in the first image reading chip group may select the first drive capability, and the second output selection units of the plurality of image reading chips included in the second image reading chip group may select the third drive capability.

With the image reading apparatus according to the present application example, in the plurality of image reading chips included in the first image reading chip group, the drive capability of the first output circuits is set to the first drive capability (drive capability that is not the largest), which is smaller than the second drive capability, such that the drive capability matches the size of the load of the transfer wire for the output signals and does not become excessive, and in the plurality of image reading chips included in the second image reading chip group, the drive capability of the second output circuits is set to the third drive capability such that the drive capability matches the size of the load of the transfer wire for the output signals and does not become excessive, and therefore it is possible to suppress the occurrence of excessive power consumption and excessive noise accompanying signal transfer.

Also, with the image reading apparatus according to the present application example, the drive capabilities of the first output circuits of the plurality of image reading chips included in the first image reading chip group are all set to the first drive capability and the drive capabilities of the second output circuits of the plurality of image reading chips included in the second image reading chip group are all set to the third drive capability, and therefore variation in the image reading precision (quality) can be reduced.

Application Example 5

With the image reading apparatus according to the above-described application example, the number of the image reading chips included in the second image reading chip group may be larger than the number of the image reading chips included in the first image reading chip group, and the third drive capability may be larger than the first drive capability.

With the image reading apparatus according to the present application example, the load of the wire by which the output signals from the plurality of image reading chips included in the second image reading chip group are sequentially transferred is larger than the load of the wire by which the output signals from the plurality of image reading chips included in the first image reading chip group are sequentially transferred, and therefore by making the third drive capability larger than the first drive capability, it is possible to effectively suppress excessive power consumption and excessive noise accompanying signal transfer.

Application Example 6

With the image reading apparatus according to the above-described application example, the first image reading chip may include a first terminal, the first output selection unit may select the drive capability of the first output circuit based on a signal input to the first terminal, the second image reading chip may include a second terminal, and the second output selection unit may selects the drive capability of the second output circuit based on a signal input to the second terminal.

With the image reading apparatus according to the present application example, in the first image reading chip, the drive capability of the first output circuit can be set appropriately based on the signal input to the first terminal, and in the second image reading chip, the drive capability of the second output circuit can be set appropriately based on the signal input to the second terminal, and therefore it is possible to suppress the occurrence of excessive power consumption and excessive noise accompanying signal transfer.

Application Example 7

The image reading apparatus according to the above-described application example may include a control unit configured to control an operation of the image sensor module, and at least one of the signal input to the first terminal and the signal input to the second terminal may be transferred from the control unit.

With the image reading apparatus according to the present application example, if the drive capability of the first output circuit of the first image reading chip is selected based on the signal transferred from the control unit, after the image reading apparatus is assembled, the drive capability of the first output circuit can be changed according to a change in the load of the output signal from the first image reading chip, and it is possible to effectively suppress the occurrence of excessive power consumption and excessive noise accompanying signal transfer. Also, with the image reading apparatus according to the present application example, if the drive capability of the second output circuit of the second image reading chip is selected based on the signal transferred from the control unit, after the image reading apparatus is assembled, the drive capability of the second output circuit can be changed according to a change in the load of the output signal from the second image reading chip, and it is possible to efficiently suppress the occurrence of excessive power consumption and excessive noise accompanying signal transfer.

Application Example 8

With the image reading apparatus according to the above-described application example, at least one of the signal input to the first terminal and the signal input to the second terminal may be a signal for setting the drive capability and for setting a resolution for reading the image.

With the image reading apparatus according to the present application example, for example, a signal for setting the drive capability of the first output circuit of the first image reading chip can be used as a signal for setting the resolution for image reading performed by the first image reading chip, and therefore a dedicated terminal to which the signal for setting the drive capability of the first output circuit is supplied is not needed in the first image reading chip. Also, with the image reading apparatus according to the present application example, for example, a signal for setting the drive capability of the second output circuit of the second image reading chip can also be used as a signal for setting the resolution for image reading performed by the second image reading chip, and therefore a dedicated terminal to which the signal for setting the drive capability of the second output circuit is supplied is not needed in the second image reading chip.

Application Example 9

With the image reading apparatus according to the above-described application example, at least one of the first terminal and the second terminal may be electrically connected to a voltage source that outputs a fixed voltage.

With the image reading apparatus according to the present application example, during assembly, the drive capability of the first output circuit of the first image reading chip can be easily set by connecting the first terminal of the first image reading chip to a predetermined voltage source. Also, with the image reading apparatus according to the present application example, during assembly, the drive capability of the second output circuit of the second image reading chip can be easily set by connecting the second terminal of the second image reading chip to a predetermined voltage source.

Application Example 10

With the image reading apparatus according to the above-described application example, the first image reading chip and the second image reading chip may be chips of the same type.

With the image reading apparatus according to the above-described application example, the characteristics of the first image reading chip and the characteristics of the second image reading chip are similar, and therefore variation in the image reading precision (quality) can be reduced.

Application Example 11

An image sensor module according to the present application example includes: a first image reading chip; a second image reading chip; a third terminal; and a fourth terminal, wherein the first image reading chip includes: a first pixel portion that is configured to output a first pixel signal and includes a first light-receiving element that receives and photoelectrically converts light from an image; a first output circuit that can output a signal based on the first pixel signal with one of a plurality of drive capabilities including a first drive capability and a second drive capability that is larger than the first drive capability; and a first output selection unit configured to select a drive capability of the first output circuit from the plurality of drive capabilities, the second image reading chip includes: a second pixel portion that is configured to output a second pixel signal and includes a second light-receiving element that receives and photoelectrically converts light from the image; a second output circuit that can output a signal based on the second pixel signal with one of a plurality of drive capabilities including a third drive capability; and a second output selection unit configured to select a drive capability of the second output circuit from the plurality of drive capabilities, the signal output from the first output circuit is output from the third terminal, the signal output from the second output circuit is output from the fourth terminal, and the first output selection unit selects the first drive capability.

With the image sensor module according to the present application example, in the first image reading chip, the drive capability of the first output circuit is set to a first drive capability (drive capability that is not the largest), which is smaller than the second drive capability, such that the drive capability matches the size of the load of the transfer wire for the output signal and does not become excessive, and in the second image reading chip, the drive capability of the second output circuit can be set appropriately such that the drive capability matches the size of the load of the transfer wire for the output signal and does not become excessive, and therefore it is possible to suppress excessive power consumption and excessive noise accompanying signal transfer.

Also, with the image sensor module according to the present application example, the output signal from the first image reading chip is output from the third terminal and the output signal from the second image reading chip is output from the fourth terminal, and therefore output of the output signal from the first image reading chip and output of the output signal from the second image reading chip can be performed in parallel, and it is possible to increase the speed of reading the image.

BRIEF DESCRIPTION OF THE DRAWINGS

The invention will be described with reference to the accompanying drawings, wherein like numbers reference like elements.

FIG. 12 is a diagram showing an example of a truth-value table for decoding logic used by an output selection unit.

DESCRIPTION OF EXEMPLARY EMBODIMENTS

Hereinafter, preferred embodiments of the invention will be described in detail with reference to the drawings. The drawings are used for the sake of convenience in the description. Note that the embodiments described hereinafter are not to be unduly limited to the content of the present invention disclosed in the scope of the claims. Also, all configurations described hereinafter are not necessarily essential constituent components of the present invention.

Hereinafter, a scanner 1, which is an example of an image reading apparatus of the invention, will be described with reference to the accompanying drawings.

1. First Embodiment 1-1. Structure of Scanner

Figure 1:
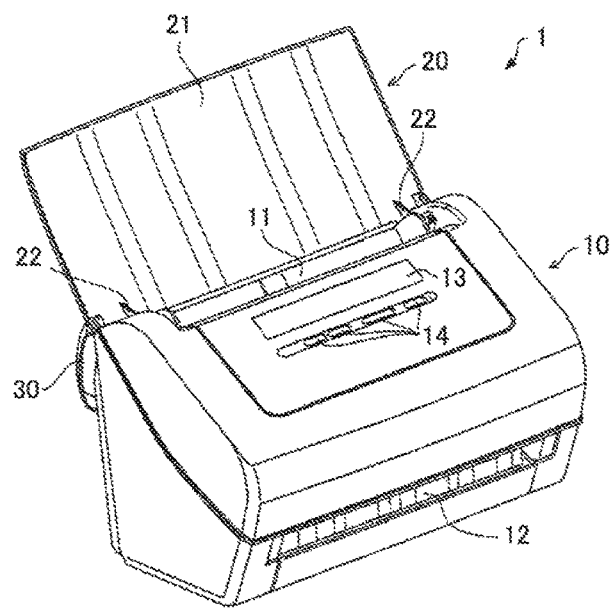
FIG. 1 is a perspective view illustrating an exterior of a scanner according to a first embodiment.

FIG. 1 is a perspective view illustrating an exterior of the scanner 1 (image reading apparatus) according to the first embodiment. The scanner 1 of the first embodiment is an image reading scanner that optically reads an object to be read and outputs image data.

As shown in FIG. 1, the scanner 1 includes a case 10, a front cover plate 20, and a rear cover plate 30.

The front cover plate 20 includes a plate-shaped portion 21 that is formed into an approximately rectangular shape, and leg portions 22, and an original document (an example of a "medium on which an image is formed") to be introduced into an introduction port is supported on the plate-shaped portion 21.

The case 10 has an approximate box shape and stores various later-described apparatuses in its interior. The case 10 includes a sheet supply port 11, a sheet discharge port 12, a display panel 13, and operation switches 14. The sheet supply port 11 is arranged on the upper side of the case 10, and an original document on the plate-shaped portion 21 of the front cover plate 20 is introduced into the sheet supply port 11 between the leg portions 22. The sheet discharge port 12 discharges an original document that was introduced through the sheet supply port 11 and had an image thereof read by an internal apparatus. The display panel 13 is arranged on the upper side of the case 10 and displays the operation state of the scanner 1, in addition to the reading precision, reading range, and the like. The operation switches 14 enable input of operations, reading precision, and the like of the scanner 1.

The rear cover plate 30 is arranged on the rear side of the front cover plate 20 and is provided so as to cover the sheet supply port 11 when the front cover plate 20 is closed.

Figure 2:
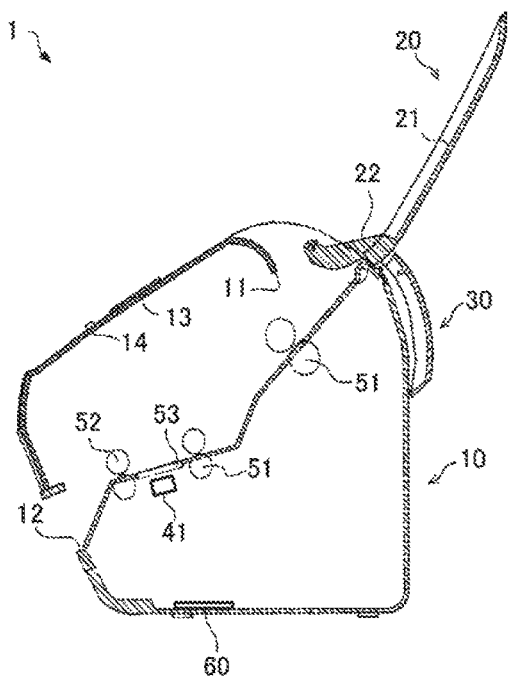
FIG. 2 is a diagram illustrating a cross-section of the scanner according to the first embodiment.

FIG. 2 is a diagram illustrating a cross section of the scanner 1. The operation of the scanner 1 will be described with reference to FIG. 2. Inside of the case 10, the scanner 1 includes sheet supply rollers 51, sheet discharge rollers 52, a transparent plate 53, an image sensor module 41 for reading an image, and a main substrate 60. The scanner 1 transports an original document mounted on the plate-shaped portion 21 through the sheet supply port 11 to the transparent plate 53 using the sheet supply rollers 51. When the original document is transported to the transparent plate 53, the image sensor module 41 emits light to the original document surface via the transparent plate 53, receives the light reflected from the original document (light from the image), and generates image signals based on signals obtained by photoelectric conversion, whereby the image of the original document surface is read. For example, the image sensor module 41 is a CMOS (Complementary metal-oxide-semiconductor) line sensor of a CIS (Contact Image Sensor) type. The image signals generated by the image sensor module 41 are transferred to the main substrate 60 and processed. Then, the original document is read one line at a time, and the document is transported in the direction of the sheet discharge port 12 by the rollers each time reading ends. The original document that was read is transported to the sheet discharge port 12 by the sheet discharge rollers 52.

The sheet supply rollers 51 and the sheet discharge rollers 52 constitute transport portions that transport the original document, and the scanner 1 of the first embodiment is a so-called sheet-feeding scanner.

Figure 3:
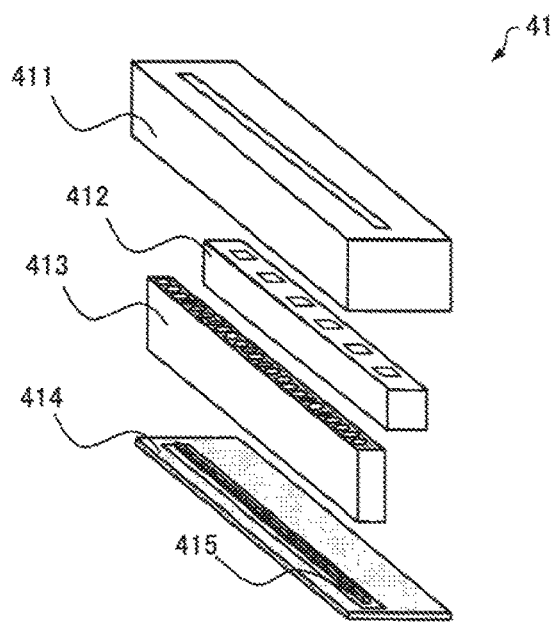
FIG. 3 is an exploded perspective view schematically showing a configuration of an image sensor module.

FIG. 3 is an exploded perspective view schematically showing a configuration of the image sensor module 41. In the example shown in FIG. 3, the image sensor module 41 is constituted by including a case 411, a light source 412, a lens 413, a module substrate 414, and image reading chips 415 (semiconductor devices) for reading an image. The light source 412, the lens 413, and the image reading chips 415 are accommodated between the case 411 and the module substrate 414. The case 411 is provided with a slit. For example, the light source 412 has R, G, and B light-emitting diodes (LEDs), and sequentially causes the R, G, and B light-emitting diodes (red LED, green LED, and blue LED) to emit light while switching therebetween at a high speed.

The light emitted by the light source 412 is emitted via the slit to a medium being read, and the light from the medium being read is input to the lens 413 via the slit. The lens 413 guides the input light to the image reading chips 415.

Figure 4:
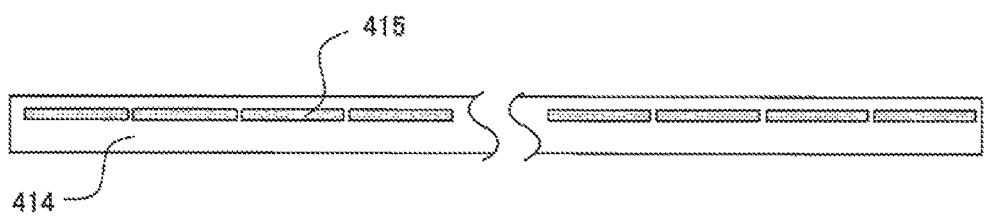
FIG. 4 is a plan view schematically showing an arrangement of image reading chips.
Figure 4:
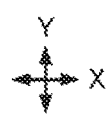

FIG. 4 is a plan view schematically showing an arrangement of the image reading chips 415. As shown in FIG. 4, multiple (m) image reading chips 415 are arranged in alignment in a one-dimensional direction (in FIG. 4, the X-axis direction) on the module substrate 414. The image reading chips 415 have many light receiving elements (see FIGS. 7 and 8) arranged in a line, and thus it is possible to realize a scanner 1 whose image reading resolution is higher the higher the density of the light receiving elements of the image reading chips 415 is. Also, it is possible to realize a scanner 1 that can read larger images the larger the number of image reading chips 415 is.

1-2. Functional Configuration of Scanner

Figure 5:
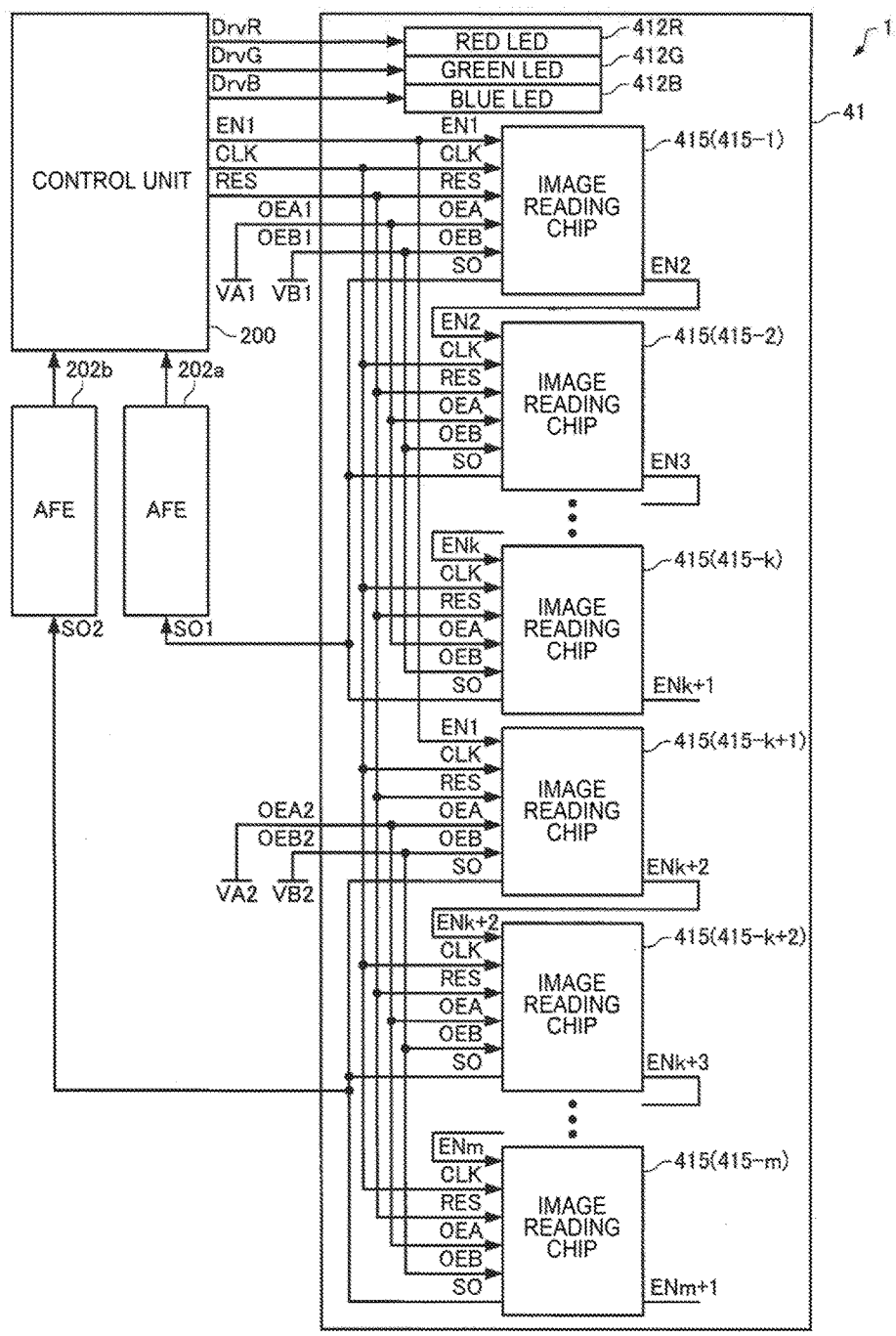
FIG. 5 is a diagram illustrating an example of a functional configuration of the scanner according to the first embodiment.

FIG. 5 is a functional block diagram showing an example of a functional configuration of the scanner 1 of the first embodiment. In the example shown in FIG. 5, the scanner 1 is constituted by including a control unit 200, two analog front ends (AFEs) 202a and 202b, a red LED 412R, a green LED 412G, a blue LED 412B and m image reading chips 415 (415-1 to 415-m). The red LED 412R, the green LED 412G, the blue LED 412B, and the m image reading chips 415 (415-1 to 415-m) are included in the image sensor module 41. As described above, the red LED 412R, the green LED 412G, and the blue LED 412B are included in the light source 412, and the multiple image reading chips 415 are arranged in alignment on the module substrate 414. Multiple red LEDs 412R, green LEDs 412G, and blue LEDs 412B may exist. Also, the control unit 200 and the analog front ends (AFEs) 202a and 202b are included on the main substrate 60 (control substrate) shown in FIG. 2, which is different from the module substrate 414. The control unit 200 and the analog front ends (AFEs) 202a and 202b may be realized by integrated circuits (ICs).

The control unit 200 controls the operation of the image sensor module 41. First, the control unit 200 controls the operation of the red LED 412R, the green LED 412G, and the blue LED 412B. Specifically, the control unit 200 supplies a driving signal DrvR with a fixed period T for a fixed exposure time Δt to the red LED 412R and causes the red LED 412R to emit light. Similarly, the control unit 200 supplies a driving signal DrvG with the period T for the exposure time Δt to the green LED 412G to cause the green LED 412G to emit light, and supplies a driving signal DrvB with the period T for the exposure time Δt to the blue LED 412B to cause the blue LED 412B to emit light. The control unit 200 causes the red LED 412R, the green LED 412G, and the blue LED 412B to exclusively emit light one-by-one in sequence for the period T.

Also, the control unit 200 controls operation of the m image reading chips 415 (415-1 to 415-m). Specifically, the control unit 200 supplies the clock signal CLK and the resolution setting signal RES to all of the m image reading chips 415 (415-1 to 415-m). The clock signal CLK is an operation clock signal for the m image reading chips 415, and the m image reading chips 415 operate based on the clock signal CLK. Also, the resolution setting signal RES is a signal for setting the resolution for image reading performed by the scanner 1. The resolution is set according to the number of rising edges of the clock signal CLK in the period during which the resolution setting signal RES is active (in the present embodiment, at a high level).

Figure 6:
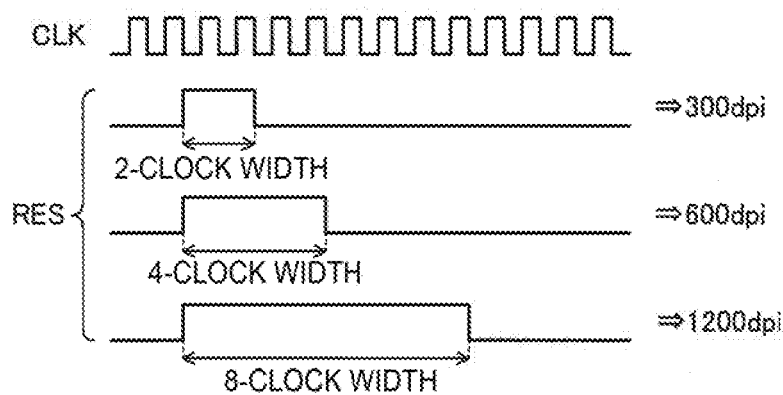
FIG. 6 is a diagram showing an example of a resolution setting signal.

As shown in FIG. 6, in the present embodiment, the resolution 300 dpi is set in the case where the number of the rising edges of the clock signal CLK in the period for which the resolution setting signal RES is active (at a high level) is 2, the resolution 600 dpi is set in the case where the number of the rising edges of the clock signal CLK in the period for which the resolution setting signal RES is active (at a high level) is 4, and the resolution 1200 dpi is set in the case where the number of the rising edges of the clock signal CLK in the period for which the resolution setting signal RES is active (at a high level) is 8.

The light receiving elements of the image reading chip 415-$j$ ($j$=1 to m) receive light from the image formed on the medium to be read, and thereafter, upon receiving a chip enable signal ENj (in the present embodiment, a high-pulse signal), the image reading chip 415-$j$ generates and outputs an image signal SO having image information with the resolution set by the resolution setting signal RES based on the light received by the light receiving elements, in synchronization with the clock signal CLK.

In the present embodiment, the control unit 200 causes the red LED 412R, the green LED 412G, or the blue LED 412B to emit light, and thereafter generates the chip enable signal EN1, which is active (at a high level) for a fixed amount of time (amount of time until the image reading chip 415-1 ends output of the image signal SO), and supplies the chip enable signal EN1 to the image reading chip 415-1 (an example of a "first image reading chip") and the image reading chip 415-$k$+1 (an example of a "second image reading chip").

The image reading chip 415-$j$ ($j$=1 to k) generates the chip enable signal ENj+1 (high-pulse signal) slightly before the output of the image signal SO ends. Then, the chip enable signals EN2 to ENk are supplied to the image reading chips 415-2 to 415-$k$ respectively. Similarly, the image reading chip 415-$j$ ($j$=k+1 to m) generates the chip enable signal EN+1 (high-pulse signal) slightly before the output of the image signal SO ends. Then, the chip enable signals ENk+2 to ENm are supplied to the image reading chips 415-$k$+2 to 415-$m$ respectively.

Accordingly, after the red LED 412R, the green LED 412G, or the blue LED 412B emits light, the k image reading chips 415 (415-1 to 415-$k$) sequentially output the image signals SO, and at the same time thereas, the m-k image reading chips 415 (415-$k$+1 to 415-$m$) sequentially output the image signals SO. Also, the image sensor module 41 outputs the image signals SO sequentially output by the k image reading chips 415 (415-1 to 415-$k$) as image signals SO1 from a terminal (not shown) (an example of a "third terminal") and outputs the image signals SO sequentially output by the m-k image reading chips 415 (415-$k$+1 to 415-$m$) as image signals SO2 from another terminal (not shown) (an example of a "fourth terminal").

The image signals SO1 are transferred to the main substrate 60 by being transmitted through a wire (not shown) that electrically connects the image sensor module 41 (k image reading chips 415) and the main substrate 60 on which the analog front ends (AFE) 202a and 202b and the control unit 200 are mounted. Also, the image signals SO2 are transferred to the main substrate 60 by being transmitted through a wire (not shown) that electrically connects the image sensor module 41 (m-k image reading chips 415) and the main substrate 60.

Thus, in the present embodiment, the image sensor module 41 includes a first image reading chip group composed of multiple (k) image reading chips 415 (415-1 to 415-$k$) and a second image reading chip group composed of multiple (m-k) image reading chips 415 (415-$k$+1 to 415-$m$). Also, the multiple (k) image reading chips 415 included in the first image reading chip group are electrically connected to the analog front end (AFE) 202*a*, and the multiple (m-k) image reading chips 415 included in the second image reading chip group are electrically connected to the analog front end (AFE) 202*b*.

Here, the m image reading chips 415 (415-1 to 415-*m*) can output the image signals SO with multiple drive capabilities selected based on output control signals OEA and OEB, with input terminals IP4 (see FIG. 7) being supplied with the output control signal OEA and input terminals IP5 (see FIG. 7) being supplied with the output control signal OEB. In particular, in the present embodiment, with the k image reading chips 415 (415-1 to 415-*k*), the input terminals IP4 (see FIG. 7) are electrically connected to a voltage source (not shown) that outputs a fixed voltage VA1 via a bonding wire or the like, and the input terminals IP5 (see FIG. 7) are electrically connected to a voltage source (not shown) that outputs a fixed voltage VB1 via a bonding wire or the like. Accordingly, to the k image reading chips 415 (415-1 to 415-*k*), the output control signal OEA1 with the fixed voltage VA1 is supplied as the output control signal OEA, and the output control signal OEB1 with the fixed voltage VB1 is supplied as the output control signal OEB. Also, in the m-k image reading chips 415 (415-*k*+1 to 415-*m*), the input terminals IP4 (see FIG. 7) are electrically connected to a voltage source (not shown) that outputs a fixed voltage VA2 via a bonding wire or the like, and the input terminals IP5 (see FIG. 7) are electrically connected to a voltage source (not shown) that outputs a fixed voltage VB2 via a bonding wire or the like. Accordingly, in the m-k image reading chips 415 (415-*k*+1 to 415-*m*), the output control signal OEA2 with the fixed voltage VA2 is supplied as the output control signal OEA, and the output control signal OEB2 with the fixed voltage VB2 is supplied as the output control signal OEB. Note that these voltage sources may be provided inside of the scanner 1, or may be provided outside thereof. In the present embodiment, the m image reading chips 415 (415-1 to 415-*m*) are all the same type of chip (IC chips with the same configuration), and the detailed circuit configurations and operations of the image reading chips 415 will be described later.

The analog front end (AFE) 202*a* (an example of a "first reception unit") sequentially receives the image signals SO (image signals SO1) sequentially output from the output circuits 140 (see FIG. 7) of the k image reading chips 415 (415-1 to 415-*k*), performs amplification processing and A/D conversion processing on the image signals SO, converts the image signals SO into digital signals including digital values corresponding to the light reception amounts of the light-receiving elements, and sequentially transmits the digital signals to the control unit 200.

Similarly, the analog front end (AFE) 202*b* (an example of a "second reception unit") sequentially receives the image signals SO (image signals SO2) sequentially output from the output circuits 140 (see FIG. 7) of the m-k image reading chips 415 (415-*k*+1 to 415-*m*), performs amplification processing and A/D conversion processing on the image signals SO, converts the image signals SO into digital signals including digital values corresponding to the light reception amounts of the light-receiving elements, and sequentially transmits the digital signals to the control unit 200.

The control unit 200 receives the digital signals transmitted sequentially from the analog front end (AFE) 202*a* and the digital signals transmitted from the analog front end (AFE) 202*b* and generates information on the image read by the image sensor module 41.

1-3. Configuration and Operation of Image Reading Chip

Figure 7:
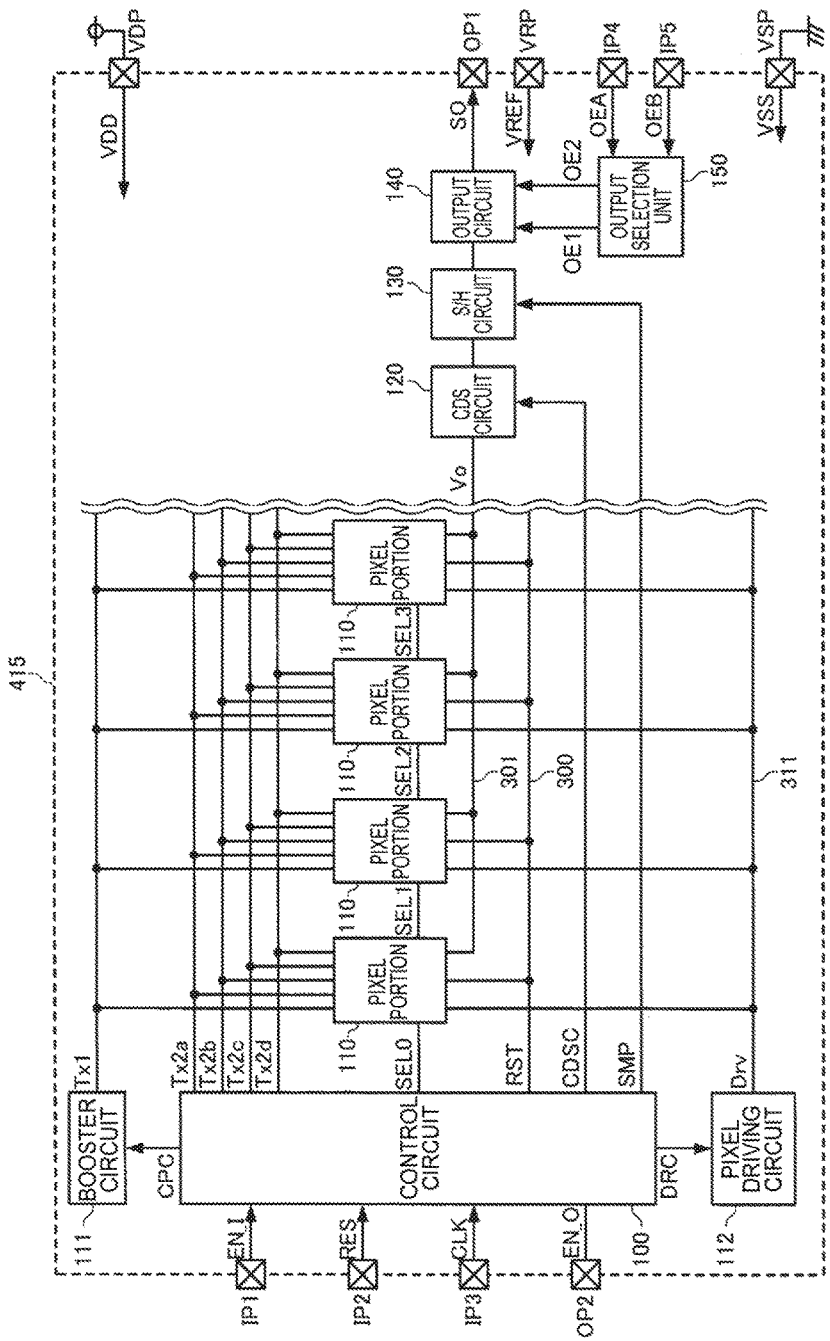
FIG. 7 is a diagram showing functional blocks of an image reading chip.

FIG. 7 is a functional block diagram of an image reading chip 415. The image reading chip 415 shown in FIG. 7 includes a control circuit 100, a booster circuit 111, a pixel driving circuit 112, n pixel portions 110, a CDS (Correlated Double Sampling) circuit 120, a sampling/holding circuit 130, an output circuit 140, and an output selection unit 150. The image reading chip 415 receives supply of a power source voltage VDD (e.g., 3.3 V) and a power source voltage VSS (e.g., 0 V) through two power source terminals VDP and VSP respectively, and operates based on a chip enable signal EN_I (one of the chip enable signals EN1 to ENk and ENk+2 to ENm shown in FIG. 5), the resolution setting signal RES, and the clock signal CLK, which are input through three input terminals IP1, IP2, and IP3 respectively, the output control signals GEA and OEB, which are input through the two input terminals IP2 and IP5 respectively, and the reference voltage VREF, which is supplied through a reference voltage supply terminal VRP.

The chip enable signal EN_I, the resolution setting signal RES, and the clock signal CLK are input to the control circuit 100. The control circuit 100 controls operation of the booster circuit 111, the pixel driving circuit 112, the n pixel portions 110, the CDS circuit 120, and the sampling/holding circuit 130 based on the chip enable signal EN_I, the resolution setting signal RES, and the clock signal CLK. Specifically, the control circuit 100 generates a control signal CPC for controlling the booster circuit 111, a control signal DRC for controlling the pixel driving circuit 112, a control signal CDSC for controlling the CDS circuit 120, a sampling signal SMP for controlling the sampling/holding circuit 130, a pixel selection signal SEL0, reset signal RST, and second transfer control signals Tx2 (Tx2*a*, Tx2*b*, Tx2*c*, and Tx2*d*) for controlling the pixel portion 110, and a chip enable signal EN_O. The specific circuit configuration and operation of the control circuit 100 will be described later.

Based on the control signal CPC from the control circuit 100, the booster circuit 111 boosts the power source voltage VDD and generates a first transfer control signal Tx1 with the boosted power source voltage being a high level. The first transfer control signal Tx1 is a control signal for transferring a charge (charge accumulated in a light-receiving element) generated based on photoelectric conversion performed by the light-receiving element for an exposure time Δt, and the first transfer control signal Tx1 is supplied to all of the n pixel portions 110.

Based on the control signal DRC from the control circuit 100, the pixel driving circuit 112 generates a driving signal Drv for driving the n pixel portions 110. The n pixel portions 110 are provided in alignment in a one-dimensional direction, and the driving signal Drv is transferred to the n pixel portions 110 using a driving signal line 311. Then, when the driving signal Drv is active (high level) and the pixel selection signal SELi−1 is active (high level), the i-th (i being one of 1 to n) pixel portion 110 sets the pixel selection signal SELi to active (high level) and outputs an output signal (pixel signal). The pixel selection signal SELi is output to the i+1-th pixel portion 110.

The n pixel portions (examples of "first pixel portions" or "second pixel portions") 110 include light-receiving elements (examples of "first light-receiving elements" or "second light-receiving elements") that receive and photoelectrically convert light from an image formed on a medium to be read, and each outputs a pixel signal (an example of a "first pixel signal" or a "second pixel signal") with a voltage corresponding to light received by the light-receiving element during the exposure time Δt based on the first transfer control signal Tx1, the second transfer control signals Tx2, the pixel selection signal SEL (one of SEL0 to SELn−1), the reset signal RST, and the driving signal Drv. The output signals (pixel signals) output from the n pixel portions 110 are sequentially transferred to the CDS circuit 120 using an output signal line 301.

Figure 8:
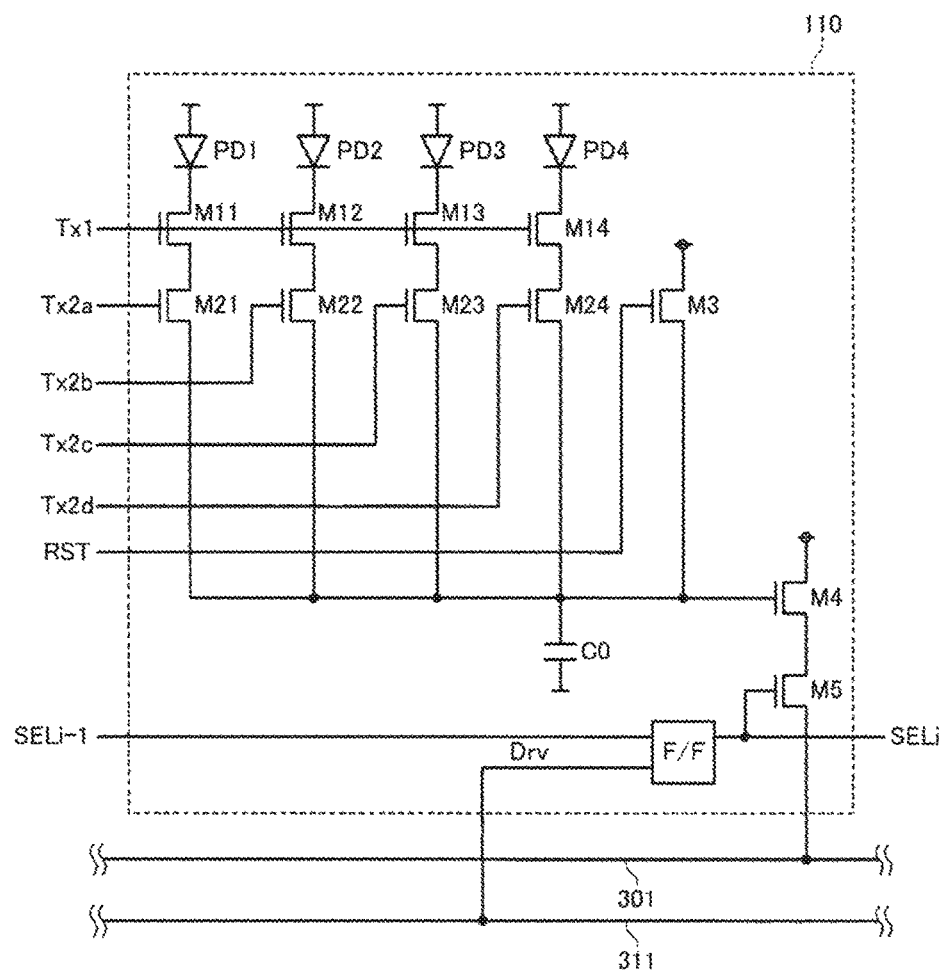
FIG. 8 is a diagram showing a configuration of a pixel portion.

The n pixel portions 110 all have the same configuration, and FIG. 8 is a diagram showing the configuration of a pixel portion 110 (i-th pixel portion 110). As shown in FIG. 8, the pixel portion 110 includes four light-receiving elements PD1, PD2, PD3, and PD4. In other words, the pixel portion 110 includes four pixels.

The light-receiving elements PD1, PD2, PD3, and PD4 receive light (in the present embodiment, light from an image formed on a medium to be read) and convert it into an electrical signal (perform photoelectric conversion). In the present embodiment, the light-receiving elements PD1, PD2, PD3, and PD4 are constituted by photodiodes with grounded anodes. The cathode of the light-receiving element PD1 is connected to the source of an NMOS transistor M11, the cathode of the light-receiving element PD2 is connected to the source of an NMOS transistor M12, the cathode of the light-receiving element PD3 is connected to the source of an NMOS transistor M13, and the cathode of the light-receiving element PD4 is connected to the source of an NMOS transistor M14.

The drain of the NMOS transistor M11 is connected to the source of an NMOS transistor M21, the drain of the NMOS transistor M12 is connected to the source of an NMOS transistor M22, the drain of the NMOS transistor M13 is connected to the source of an NMOS transistor M23, and the drain of the NMOS transistor M14 is connected to the source of an NMOS transistor M24. The first transfer control signal Tx1 is supplied to the gates of the four NMOS transistors M11, M12, M13, and M14. Accordingly, the NMOS transistors M11, M12, M13, and M14 function as switches that switch on and off based on the first transfer control signal Tx1.

The drains of the four NMOS transistors M21, M22, M23, and M24 are connected in common to the source of an NMOS transistor M3, the gate of an NMOS transistor M4, and one end of a capacitor C0. The other end of the capacitor C0 is grounded. A signal Tx2a is supplied to the gate of the NMOS transistor M21, a signal Tx2b is supplied to the gate of the NMOS transistor M22, a signal Tx2c is supplied to the gate of the NMOS transistor M23, and a signal Tx2d is supplied to the gate of the NMOS transistor M24.

For example, the power source voltage VDD is supplied to the drain of the NMOS transistor M3, and the reset signal RST is supplied to the gate of the NMOS transistor M3.

For example, the power source voltage VDD is supplied to the drain of the NMOS transistor M4, and the source of the NMOS transistor M4 is connected to the drain of the NMOS transistor M5.

The source of the NMOS transistor M5 is connected to the output signal line 301 and the output signal (pixel selection signal SELi) of a flip-flop (F/F) is supplied to the gate of the NMOS transistor M5.

The flip-flop (F/F) receives input of the pixel selection signal SELi−1 and the driving signal Drv and outputs the pixel selection signal SELi which is generated by delaying the pixel selection signal SELi−1 taken in at the rising edge of the driving signal Drv. Note that the pixel selection signal SELi is a non-synchronous reset signal of the flip-flop (F/F) delayed by a delay circuit (not shown). For this reason, after the pixel selection signal SELi becomes active (high level), the pixel selection signal SELi returns to inactive (low level) upon the elapse of a desired amount of time.

The thus-configured i-th pixel portion 110 operates as follows. First, in exposure time Δt, the first transfer control signal Tx1, the second transfer control signals Tx2 (Tx2a, Tx2b, Tx2c, and Tx2d), the pixel selection signal SELi−1, and the driving signal Drv are all inactive (low level), and the light-receiving elements PD1, PD2, PD3, and PD4 accumulate charge (negative charge) corresponding to the received light.

Next, only the first transfer control signal Tx1 becomes active (high level), and all four of the NMOS transistors M11, M12, M13, and M14 are switched on. Accordingly, the charge generated based on the photoelectric conversion performed by the light-receiving element PD1 (the charge (negative charge) accumulated in the light-receiving element PD1) is transferred via the NMOS transistor M11 to an intermediate accumulation capacitor C1 (not shown) formed at a connection node between the drain of the NMOS transistor M11 and the source of the NMOS transistor M21, and the charge is accumulated therein. Also, the charge generated based on the photoelectric conversion performed by the light-receiving element PD2 (the charge (negative charge) accumulated in the light-receiving element PD2) is transferred via the NMOS transistor M12 to an intermediate accumulation capacitor C2 (not shown) formed at a connection node between the drain of the NMOS transistor M12 and the source of the NMOS transistor M22, and the charge is accumulated therein. Also, the charge generated based on the photoelectric conversion performed by the light-receiving element PD3 (the charge (negative charge) accumulated in the light-receiving element PD3) is transferred via the NMOS transistor M13 to an intermediate accumulation capacitor C3 (not shown) formed at a connection node between the drain of the NMOS transistor M13 and the source of the NMOS transistor M23, and the charge is accumulated therein. Also, the charge generated based on the photoelectric conversion performed by the light-receiving element PD4 (the charge (negative charge) accumulated in the light-receiving element PD4) is transferred via the NMOS transistor M14 to an intermediate accumulation capacitor C4 (not shown) formed at a connection node between the drain of the NMOS transistor M14 and the source of the NMOS transistor M24, and the charge is accumulated therein.

Next, the first transfer control signal Tx1 becomes inactive (low level) and the driving signal Drv supplied to the pixel portion 110 repeatedly becomes active (high level) and inactive (low level) each half-cycle of the clock signal CLK.

Also, the reset signal RST becomes active (high level) for a fixed amount of time each cycle of the clock signal CLK. Accordingly, the NMOS transistor M3 switches on so as to reset the capacitor C0, and a fixed amount of charge (positive charge) is accumulated in the capacitor C0. Also, each cycle of the clock signal CLK, the reset signal RST returns to inactive (low level) and at least one of the four signals Tx2a, Tx2b, Tx2c, and Tx2d constituting the second transfer control signals Tx2 becomes active (high level) for a fixed amount of time.

Specifically, when the resolution is set to 1200 dpi, first, in one cycle of the clock signal CLK, only the signal Tx2a becomes active (high level) for a fixed amount of time. Next, in one cycle of the clock signal CLK, only the signal Tx2b becomes active (high level) for a fixed amount of time. Next, in one cycle of the clock signal CLK, only the signal Tx2c becomes active (high level) for a fixed amount of time. Next, in one cycle of the clock signal CLK, only the signal Tx2d becomes active (high level) for a fixed amount of time. This is repeated for the four signals Tx2a, Tx2b, Tx2c, and Tx2d.

Also, when the resolution is set to 600 dpi, first, in one cycle of the clock signal CLK, only the two signals Tx2a and Tx2b simultaneously become active (high level) for a fixed amount of time. Next, in one cycle of the clock signal CLK, only the two signals Tx2c and Tx2d simultaneously become active (high level) for a fixed amount of time, and this operation is repeated.

Also, when the resolution is set to 300 dpi, first, in one cycle of the clock signal CLK, the four signals Tx2a, Tx2b, Tx2c, and Tx2d simultaneously become active (high level) for a fixed amount of time, and this operation is repeated.

Then, when at least one of the four signals Tx2a, Tx2b, Tx2c, and Tx2d becomes active (high level) for a fixed amount of time, at least one of the four NMOS transistors M21, M22, M23, and M24 switches on, and the fixed amount of charge (positive charge) accumulated in the capacitor C0 decreases by an amount corresponding to the charge (negative charge) accumulated in at least one of the intermediate accumulation capacitors C1, C2, C3, and C4.

Also, in a pixel portion 110 from which a pixel signal is to be read out, the pixel selection signal SELi-1 becomes active (high level) for a fixed amount of time, the reset signal RST returns to being inactive (low level), and thereafter the pixel selection signal SELi becomes active (high level) for a fixed amount of time.

Accordingly, the NMOS transistor M5 switches on, and the current that flows in the NMOS transistor M4 changes according to the charge accumulated in the capacitor C0. Accordingly, the source potential of the NMOS transistor M4 changes and a pixel signal with a voltage corresponding to the source potential of the NMOS transistor M4 is output from the pixel portion 110 to the output signal line 301.

On the other hand, in a pixel portion 110 from which a pixel signal is not to be read out, the pixel selection signal SELi-1 remains inactive (low level), and therefore the pixel selection signal SELi is also at a low level. Accordingly, the NMOS transistor M5 is off, and the pixel signal is not output from the pixel unit 110.

Note that the output of the booster circuit 111 is used as the gate signals of the four NMOS transistors M11, M12, M13, and M14 to efficiently perform charge transfer in a short amount of time.

Returning to FIG. 7, via the output signal line 301, the CDS circuit 120 receives input of an image signal Vo that sequentially includes the pixel signals output from the n pixel portions 110, and the CDS circuit 120 operates based on the control signal CDSC from the control circuit 100. The CDS circuit 120 uses correlated double sampling using the reference voltage VREF as a reference to remove noise that is generated due to characteristic variation of amplification transistors included in the n pixel portions 110 and is superimposed on the image signal Vo. In other words, the CDS circuit 120 is a noise reduction circuit that reduces noise included in output signals (pixel signals) output from then pixel portions 110.

Based on the sampling signal SMP, the sampling/holding circuit 130 samples the image signal from which the noise was removed by the CDS circuit 120, holds the sampled signal, and outputs the signal to the output circuit 140.

The output circuit 140 amplifies the signals output by the sampling/holding circuit 130 and generates an image signal SO. As described above, the image signal SO is output from the image reading chip 415 via the output terminal OP1 and is supplied to the analog front end (AFE) 202a or the analog front end (AFE) 202b as the image signal SO1 or the image signal SO2 (see FIG. 5).

In particular, in the present embodiment, the output circuit 140 (an example of a "first output circuit" or a "second output circuit") can output the image signal SO, which is a signal based on pixel signals, using one of multiple drive capabilities including a first drive capability and a second drive capability that is larger than the first drive capability (alternatively, multiple drive capabilities including a third drive capability). Specifically, the output circuit 140 receives supply of the drive capability selection signals OE1 and OE2 and outputs the image signal SO with one of the multiple drive capabilities selected based on the drive capability selection signals OE1 and OE2.

The output selection unit 150 (an example of a "first output selection unit" or a "second output selection unit") selects a drive capability of the output circuit 140 from among the multiple drive capabilities based on the output control signals OEA and OEB input through the input terminals IP4 and IP5 (examples of a "first terminal" and a "second terminal") respectively. Specifically, the output selection unit 150 decodes the output control signals OEA and OEB input through the input terminals IP4 and IP5 respectively to generate the drive capability selection signals OE1 and OE2 and supplies the drive capability selection signals OE1 and OE2 to the output circuit 140.

Slightly before the output of the image signal SO from the output circuit 140 ends, the control circuit 100 generates the chip enable signal EN_O (one of the chip enable signals EN2 to ENm+1 shown in FIG. 5), which is a high pulse signal, and outputs it from the output terminal OP2 to the next image reading chip 415. Thereafter, the control circuit 100 causes the output circuit 140 to stop the output of the image signal SO and sets the output terminal OP1 to a high impedance.

Figure 9:
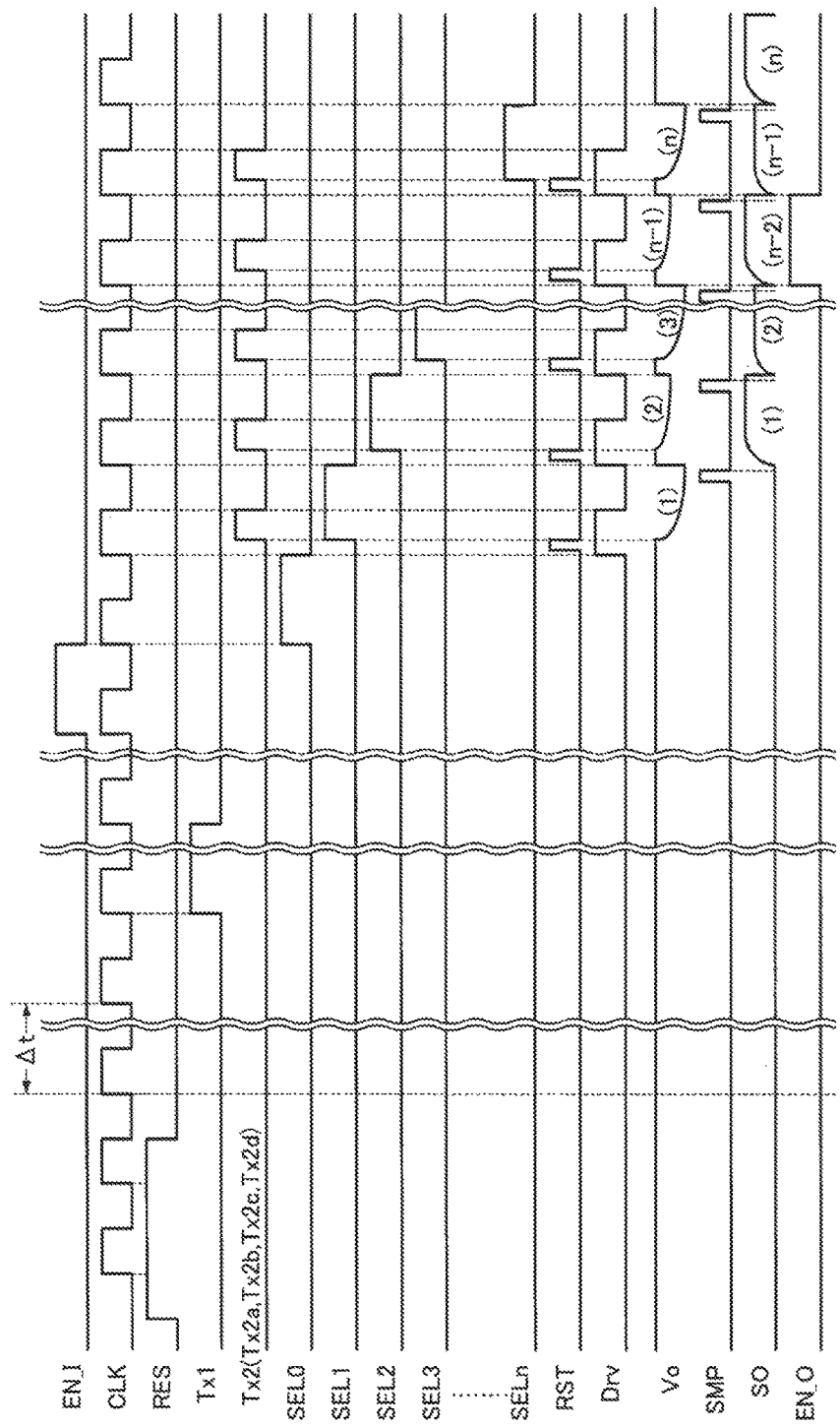
FIG. 9 is a diagram showing a timing chart for signals of an image reading chip.

FIG. 9 is a diagram showing a timing chart for signals of the image reading chip 415. Note that FIG. 9 is a diagram showing a timing chart in the case where the resolution with which the scanner 1 reads an image is set to 300 dpi.

As shown in FIG. 9, first, the resolution setting signal RES becomes high level for two cycles of the clock signal CLK. Then, when the exposure time Δt elapses, thereafter, various signals at 300 dpi are supplied to the pixel portions 110.

First, the first transfer control signal Tx1 becomes active (high level) for several cycles of the clock signal CLK.

Next, upon the chip enable signal EN_I (high pulse) being input, the pixel selection signal SEL0 becomes active (high level) for one cycle of the clock signal CLK.

Next, the driving signal Drv becomes active (high level) for a half-cycle of the clock signal CLK, and both the first transfer control signal Tx1 and the pixel selection signal SEL0 become inactive (low level). Also, the reset signal RST becomes active (high level) with a slight delay for a short time.

Next, after the reset signal RST returns to being inactive (low level), all of the four signals Tx2a, Tx2b, Tx2c, and Tx2d constituting the second transfer control signals Tx2 become active (high level) until the next falling edge of the clock signal CLK. Also, the pixel selection signal SEL1 becomes active (high level), whereby the pixel signal from the first pixel portion 110 is output to the output signal line 301, and the image signal Vo becomes a voltage corresponding to the pixel signal. The noise in the image signal Vo is removed by the CBS circuit 120, and the image signal SO reaches a voltage that corresponds to the first pixel signal in synchronization with the falling edge of the sampling signal SMP.

Next, the driving signal Drv becomes active (high level) for a half-cycle of the clock signal CLK, and the pixel selection signal SEL1 becomes inactive (low level). Also, the reset signal RST becomes active (high level) with a slight delay for a short time.

Next, after the reset signal RST returns to being inactive (low level), all of the four signals Tx2a, Tx2b, Tx2c, and Tx2d become active (high level) until the next falling edge of the clock signal CLK. Also, the pixel selection signal SEL2 becomes active (high level), whereby the pixel signal from the second pixel portion 110 is output to the output signal line 301, and the image signal Vo reaches a voltage corresponding to the pixel signal. The noise in the image signal Vo is removed by the CDS circuit 120, and the image signal SO reaches a voltage that corresponds to the second pixel signal in synchronization with the falling edge of the sampling signal SMP.

Next, the driving signal Drv becomes active (high level) for a half-cycle of the clock signal CLK, and the pixel selection signal SEL2 becomes inactive (low level). Also, the reset signal RST becomes active (high level) with a slight delay for a short time.

Hereinafter, similarly, the image signal SO reaches the voltages corresponding to the third to n-th pixel signals in synchronization with the falling edges of the sampling signal SMP.

Also, slightly before the output of the image signal SO (output of the voltage corresponding to the n-th pixel signal) ends, the chip enable signal EN_O (high pulse) is output, and when the output of the image signal SO ends, the output terminal OP1 reaches a high impedance.

1-4. Configuration of Output Circuit

Figure 10:
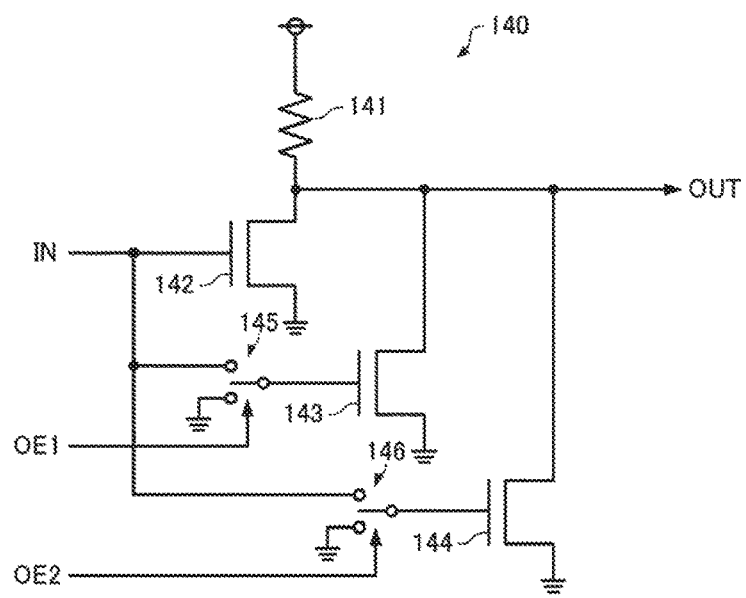
FIG. 10 is a diagram showing an example of a configuration of an output circuit.

FIG. 10 is a diagram showing an example of a configuration of the output circuit 140 according to the present embodiment. The output circuit 140 shown in FIG. 10 includes a resistor 141, three NMOS transistors 142, 143, and 144, and two switches 145 and 146.

For example, the power source voltage VDD is supplied to one end of the resistor 141, and the other end of the resistor 141 is connected to the drain terminal of the NMOS transistor 142. The signal at the other end of the resistor 141 is an output signal OUT from the output circuit 140, and the output signal OUT is the image signal SO (see FIG. 7).

The drain terminal of the NMOS transistor 142 is connected to the other end of the resistor 141, and the source terminal of the NMOS transistor 142 is grounded. Also, an input signal IN to the output circuit 140 is supplied to the gate terminal of the NMOS transistor 142. This input signal IN is the output signal of the sampling/holding circuit 130 (see FIG. 7).

A first terminal of the switch 145 is connected to the gate terminal of the NMOS transistor 142, the power source voltage VSS is supplied to a second terminal of the switch 145, and a third terminal of the switch 145 is connected to the gate terminal of the NMOS transistor 143. Also, the drive capability selection signal OE1 is supplied to the control terminal of the switch 145, and when the drive capability selection signal OE1 is active (in the present embodiment, at the high level), the first terminal and the third terminal of the switch 145 are connected, and the input signal IN is supplied to the gate terminal of the NMOS transistor 143. Also, when the drive capability selection signal OE1 is inactive (in the present embodiment, at the low level), the second terminal and the third terminal of the switch 145 are connected, and for example, the power source voltage VSS is supplied to the gate terminal of the NMOS transistor 143.

The drain terminal of the NMOS transistor 143 is connected to the other end of the resistor 141, the source terminal of the NMOS transistor 143 is grounded, and the gate terminal of the NMOS transistor 143 is connected to the third terminal of the switch 145.

A first terminal of the switch 146 is connected to the gate terminal of the NMOS transistor 142, the power source voltage VSS is supplied to a second terminal of the switch 146, and a third terminal of the switch 146 is connected to the gate terminal of the NMOS transistor 144. Also, the drive capability selection signal OE2 is supplied to the control terminal of the switch 146, and when the drive capability selection signal OE2 is active (in the present embodiment, at the high level), the first terminal and the third terminal of the switch 145 are connected, and the input signal IN is supplied to the gate terminal of the NMOS transistor 144. Also, when the drive capability selection signal OE2 is inactive (in the present embodiment, at the low level), the second terminal and the third terminal of the switch 146 are connected, and for example, the power source voltage VSS is supplied to the gate terminal of the NMOS transistor 144.

The drain terminal of the NMOS transistor 144 is connected to the other end of the resistor 141, the source terminal of the NMOS transistor 144 is grounded, and the gate terminal of the NMOS transistor 144 is connected to the third terminal of the switch 146.

For example, the three NMOS transistors 142, 143, and 144 have the same threshold values and gate sizes (W/L) (manufacturing error is allowed).

The thus-configured output circuit 140 is a common source circuit, and when the voltage of the input signal IN falls within a predetermined range in which the NMOS transistors 142, 143, and 144 operate in a linear region, the higher the voltage of the input signal IN is, the larger the current that flows in the resistor 141 is (the larger the voltage drop at the resistor 141 is), and therefore the lower the voltage of the output signal OUT is. Accordingly, if the voltage of the output signal (input signal IN) of the sampling/holding circuit 130 changes only in the predetermined range, the image signal SO (output signal OUT) is a signal obtained by inverting and amplifying the output signal of the sampling/holding circuit 130 (input signal IN).

Also, in the output circuit 140, when both the drive capability selection signal OE1 and the drive capability selection signal OE2 are inactive (low level), a current $I_1$ flows between the drain and source of the NMOS transistor 142, but no current flows between the drains and sources of the NMOS transistors 143 and 144. Accordingly, the current $I_1$ flows in the resistor 141, and the drive capability (driving current) at that time is set to $\alpha_1$.

Also, when the drive capability selection signal OE1 is active (high level) and the drive capability selection signal OE2 is inactive (low level), the current $I_1$ flows between the respective drains and sources of the NMOS transistors 142 and 143, but no current flows between the drain and source of the NMOS transistor 144. Accordingly, a current that is two times the current $I_1$ flows in the resistor 141 and the drive capability (driving current) $\alpha_2$ at that time is two times $\alpha_1$.

Also, when the drive capability selection signal OE1 and the drive capability selection signal OE2 are both active (high level), the current $I_1$ flows between the respective drains and sources of the NMOS transistors 142, 143, and 144. Accordingly, a current that is three times the current $I_1$ flows in the resistor 141 and the drive capability (driving current) $\alpha_3$ at that time is three times $\alpha_1$.

Note that with the output circuit shown in FIG. 10, if the amplification factors when the drive capabilities are $\alpha_1$, $\alpha_2$, and $\alpha_3$ are set to $\beta_1$, $\beta_2$, and $\beta_3$ respectively, $\beta_2$ is two times $\beta_1$ and $\beta_3$ is three times $\beta_1$, but the output circuit 140 may be a circuit with a configuration in which it is possible to select multiple drive capabilities with the amplification factor remaining constant.

Figure 11:
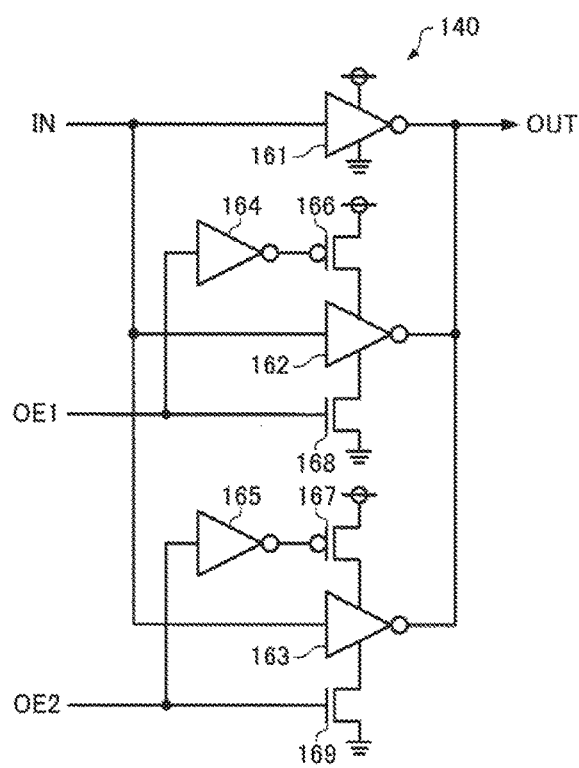
FIG. 11 is a diagram showing another example of a configuration of an output circuit.

FIG. 11 is a diagram showing an example of another configuration of the output circuit 140 according to the present embodiment. The output circuit 140 shown in FIG. 11 includes five CMOS inverter elements 161, 162, 163, 164, and 165, two PMOS transistors 166 and 167, and two NMOS transistors 168 and 169.

For example, the power source voltage VDD is supplied to a high-side power source terminal of the CMOS inverter element 161, and for example, the power source voltage USS is supplied to a low-side power source terminal of the CMOS inverter element 161. The input signal IN to the output circuit 140 is supplied to the input terminal of the CMOS inverter terminal 161. This input signal IN is the output signal of the sampling/holding circuit 130 (see FIG. 7). Also, the signal output from the output terminal of the CMOS inverter element 161 is the output signal OUT from the output circuit 140, and the output signal OUT is the image signal SO (see FIG. 7).

The drive capability selection signal OE1 is supplied to the input terminal of the CMOS inverter element 164, and the output terminal of the CMOS inverter element 164 is connected to the gate terminal of the PMOS transistor 166.

The gate terminal of the PMOS transistor 166 is connected to the output terminal of the CMOS inverter element 164, the power source voltage VDD for example is supplied to the source terminal of the PMOS transistor 166, and the drain terminal of the PMOS transistor 166 is connected to the high-side power source terminal of the CMOS inverter element 162. Accordingly, when the drive capability selection signal OE1 is active (high level), the source and drain of the PMOS transistor 166 are connected, and the power source voltage VDD for example is supplied to the high-side power source terminal of the CMOS inverter element 162.

The drive capability selection signal OE1 is supplied to the gate terminal of the NMOS transistor 168, the power source voltage VSS for example is supplied to the source terminal of the NMOS transistor 168, and the drain terminal of the NMOS transistor 168 is connected to the low-side power source terminal of the CMOS inverter element 162. Accordingly, when the drive capability selection signal OE1 is active (high level), the source and drain of the NMOS transistor 168 are connected, and the power source voltage VSS for example is supplied to the low-side power source terminal of the CMOS inverter element 162.

The high-side power source terminal of the CMOS inverter element 162 is connected to the drain terminal of the PMOS transistor 166, and the low-side power source terminal of the CMOS inverter element 162 is connected to the drain terminal of the NMOS transistor 168. Accordingly, when the drive capability selection signal OE1 is active (high level), the power source voltage VDD and the power source voltage VSS for example are supplied to the high-side power source terminal and the low-side power source terminal of the CMOS inverter element 162, whereby the CMOS inverter element 162 operates. Also, the input terminal of the CMOS inverter element 162 is connected to the input terminal of the CMOS inverter element 161 and the input signal IN is supplied thereto. Also, the output terminal of the CMOS inverter element 162 is connected to the output terminal of the CMOS inverter element 161.

The drive capability selection signal OE2 is supplied to the input terminal of the CMOS inverter element 165, and the output terminal of the CMOS inverter element 165 is connected to the gate terminal of the PMOS transistor 167.

The gate terminal of the PMOS transistor 167 is connected to the output terminal of the CMOS inverter element 165, the power source voltage VDD for example is supplied to the source terminal of the PMOS transistor 167, and the drain terminal of the PMOS transistor 167 is connected to the high-side power source terminal of the CMOS inverter element 163. Accordingly, when the drive capability selection signal OE2 is active (high level), the source and drain of the PMOS transistor 167 are connected, and the power source voltage VDD for example is supplied to the high-side power source terminal of the CMOS inverter element 163.

The drive capability selection signal OE2 is supplied to the gate terminal of the NMOS transistor 169, the power source voltage VSS for example is supplied to the source terminal of the NMOS transistor 169, and the drain terminal of the NMOS transistor 169 is connected to the low-side power source terminal of the CMOS inverter element 163. Accordingly, when the drive capability selection signal OE2 is active (high level), the source and drain of the NMOS transistor 169 are connected, and the power source voltage VSS for example is supplied to the low-side power source terminal of the CMOS inverter element 163.

The high-side power source terminal of the CMOS inverter element 163 is connected to the drain terminal of the PMOS transistor 167, and the low-side power source terminal of the CMOS inverter element 163 is connected to the drain terminal of the NMOS transistor 169. Accordingly, when the drive capability selection signal OE2 is active (high level), the power source voltage VDD and the power source voltage VSS for example are respectively supplied to the high-side power source terminal and the low-side power source terminal of the CMOS inverter element 262, whereby the CMOS inverter element 163 operates. Also, the input terminal of the CMOS inverter element 163 is connected to the input terminal of the CMOS inverter element 161 and the input signal IN is supplied thereto. Also, the output terminal of the CMOS inverter element 163 is connected to the output terminal of the CMOS inverter element 161.

For example, the three CMOS inverter elements 161, 162, and 163 have the same threshold value and gate size (W/L) (manufacturing error is allowed).

With the thus-configured output circuit 140, when the voltage of the input signal IN falls within a predetermined range in which the CMOS inverter elements 161, 162, and 163 operate in linear regions, the higher the voltage of the input signal IN is, the lower the voltage of the output signal OUT is. Accordingly, if the voltage of the output signal (input signal IN) of the sampling/holding circuit 130 changes only in the predetermined range, the image signal SO (output signal OUT) is a signal obtained by inverting and amplifying the output signal of the sampling/holding circuit 130 (input signal IN).

Also, in the output circuit 140, when both the drive capability selection signal OE1 and the drive capability selection signal OE2 are inactive (low level), the CMOS inverter element 161 operates, but the CMOS inverter elements 162 and 163 do not operate. Accordingly, the current $I_1$ flows from the high-side power source terminal to the output terminal of the CMOS inverter element 161 and the drive capability (driving current) at this time is set to $\alpha_1$.

Also, when the drive capability selection signal OE1 is active (high level) and the drive capability selection signal OE2 is inactive (low level), the CMOS inverter elements 161 and 162 operate, and the CMOS inverter element 163 does not operate. Accordingly, the current $I_1$ flows from the high-side power source terminals to the output terminals of the CMOS inverter elements 161 and 162 respectively, and the drive capability (driving current) $\alpha_2$ at this time is two times $\alpha_1$.

Also, when both the drive capability selection signal OE1 and the drive capability selection signal OE2 are active (high level), the CMOS inverter elements 161, 162, and 163 all operate. Accordingly, the current $I_1$ flows from the high-side power source terminals to the output terminals of the CMOS inverter elements 161, 162, and 163 respectively, and the drive capability (driving current) $\alpha_3$ at this time is three times $\alpha_1$.

Note that with the output circuit 140 shown in FIG. 11, if the amplification factors when the drive capabilities are $\alpha_1$, $\alpha_2$, and $\alpha_3$ are set to $\beta_1$, $\beta_2$, and $\beta_3$ respectively, $\beta_1=\beta_2=\beta_3$ is satisfied.

Thus, according to the voltage levels of the drive capability selection signals OE1 and OE2, the output circuit 140 shown in FIG. 10 or 11 can output an image signal SO, which is a signal based on the pixel signals, with one of the drive capability $\alpha_1$ (an example of a "first drive capability" or a "third drive capability"), the drive capability $\alpha_2$ (an example of a "first drive capability" or a "third drive capability"), which is larger than the drive capability $\alpha_1$, and the drive capability $\alpha_3$ (an example of a "second drive capability" or a "fourth drive capability"), which is larger than the drive capability $\alpha_1$ and larger than the drive capability $\alpha_2$. The drive capability $\alpha_1$ is the smallest among the drive capabilities $\alpha_1$, $\alpha_2$, and $\alpha_3$, and the drive capability $\alpha_3$ is the largest among the drive capabilities $\alpha_1$, $\alpha_2$, and $\alpha_3$.

As described above, the output selection unit 150 decodes the output control signals OEA and OEB input through the input terminals IP4 and IP5 respectively to generate the drive capability selection signals OE1 and OE2 and supplies the drive capability selection signals OE1 and OE2 to the output circuit 140.

Figure 12:
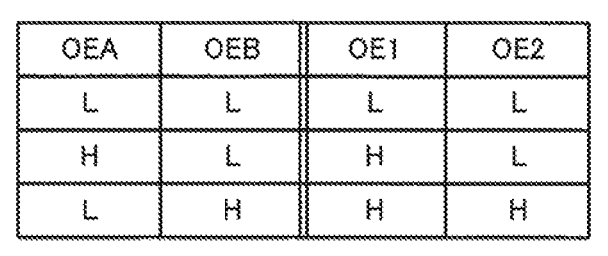

FIG. 12 shows an example of a truth value table for decoding logic used by the output selection unit 150. In the example shown in FIG. 12, if both the output control signal GEA and the output control signal OEB are at the low level, the drive capability selection signals OE1 and OE2 are both at the low level. Accordingly, if the fixed voltages VA1 (or VA2) and VB1 (or VB2) supplied to the input terminals IP4 and IP5 respectively are both the power source voltage VSS (0 V), the drive capability of the output circuit 140 shown in FIG. 10 or 11 is $\alpha_1$. Also, if the output control signal OEA is at the high level and the output control signal OEB is at the low level, the drive capability selection signal OE1 is at the high level and the drive capability selection signal OE2 is at the low level. Accordingly, if the fixed voltage VA1 (or VA2) supplied to the input terminal IP4 is the power source voltage VDD (e.g., 3.3 V) and the fixed voltage VB1 (or VB2) supplied to the input terminal IP5 is the power source voltage VSS (0 V), the drive capability of the output circuit 140 shown in FIG. 10 or 11 is $\alpha_2$. Also, if the output control signal OEA is at the low level and the output control signal OEB is at the high level, the drive capability selection signals OE1 and OE2 are both at the high level. Accordingly, if the fixed voltage VA1 (or VA2) supplied to the input terminal IP4 is the power source voltage VSS (0 V) and the fixed voltage VB1 (or VB2) supplied to the input terminal IP5 is the power source voltage VDD (e.g., 3.3 V), the drive capability of the output circuit 140 shown in FIG. 10 or 11 is $\alpha_3$.

Thus, the image reading chip 415 according to the present embodiment can output the image signal SO with a drive capability selected according to the fixed voltages VA1 (or VA2) and VB1 (or VB2) supplied to the input terminals IP4 and IP5, and is a highly versatile IC chip.

As described above, with the scanner 1 of the present embodiment, at the same time as the image signals SO (image signals SO1) are transferred from the k image reading chips 415 included in the first image reading chip group to the analog front end (AFE) 202a, the image signals SO (image signals SO2) are transferred from the m-k image reading chips 415 included in the second image reading chip group to the analog front end (AFE) 202b, and the analog front end (AFE) 202a and the analog front end (AFE) 202b operate in parallel, and therefore it is possible to increase the speed of reading the image.

Here, in the wire (transfer wire for the image signals SO1) by which the image signals SO (image signals SO1) are transferred from the k image reading chips 415 included in the first image reading chip group to the analog front end (AFE) 202a, the wire capacitance and the pad capacitances of the output terminals OP1 of the k image reading chips 415 are loads. Similarly, in the wire (transfer wire for the image signals SO2) by which the image signals SO (image signals SO2) are transferred from the m-k image reading chips 415 included in the second image reading chip group to the analog front end (AFE) 202b, the wire capacitance and the pad capacitances of the output terminals OP1 of the m-k image reading chips 415 are loads.

The wire loads of the two transfer wires are smaller compared to the wire loads in a case where the analog front end (AFE) 202b does not exist and the image signals SO (image signals SO1) are transferred from the m image reading chips 415 to the analog front end (AFE) 202a (a case where there is one transfer wire). Accordingly, if there is only one transfer wire, the load of the transfer wire is large, and therefore the drive capabilities of the output circuits 140 of them image reading chips 415 would need to be set to the largest drive capability $\alpha_3$, but in the present embodiment, the wire loads are relatively smaller, and therefore the drive capabilities of the output circuits 140 of them image reading chips 415 can be set to $\alpha_1$ or $\alpha_2$, and there is no need to set them to the largest drive capability $\alpha_3$. In view of this, in the present embodiment, in each of them image reading chips 415, the output selection unit 150 selects the drive capability $\alpha_1$ or $\alpha_2$ as the drive capability of the output circuit 140.

For example, if the number m-k of the image reading chips 415 included in the second image reading chip group is larger than the number k of the image reading chips 415 included in the first image reading chip group, the load of the transfer wire for the image signals SO2 is larger than the load of the transfer wire for the image signals SO1. In this case, the output selection units 150 of the m-k image reading chips 415 included in the first image reading chip group may select the drive capability $\alpha_1$ as the drive capability of the output circuits 140, and the output selection units 150 of the m-k image reading chips 415 included in the second image reading chip group may select the drive capability $\alpha_2$, which is greater than the drive capability $\alpha_1$, as the drive capability of the output circuits 140.

Furthermore, the scanner 1 of the present embodiment is a sheet-feeding scanner in which an original document is transported, and therefore the image sensor module 41 does not need to move. Accordingly, for example, the image sensor module 41 is fixed at a location that is relatively close to the main substrate 60, on which the analog front ends (AFEs) 202a and 202b and the control unit 200 are mounted.

Upon doing so, the wires electrically connecting the image sensor module 41 (m image reading chips 415) and the main substrate 60, or in other words, the transfer wire for the image signals SO1 and the transfer wire for the image signals SO2 are relatively short. In particular, if assembly is performed such that the distance between the image sensor module 41 and the main substrate 60 (the length of the transfer wire for the image signals SO1 and the length of the transfer wire for the image signals SO2) is extremely short, the drive capabilities of the output circuits 140 of them image reading chips 415 can be set to the smallest drive capability $\alpha_1$. In other words, in each of the m image reading chips 415, the output selection unit 150 may select the smallest drive capability $\alpha_1$ as the drive capability of the output circuit 140.

1-5. Effect

As described above, with the scanner 1 of the first embodiment, in the image reading chips 415, the drive capabilities of the output circuits 140 can be selected from among multiple drive capabilities based on the voltages VA1 and VB1 or the voltages VA2 and VB2 of the output control signals OEA and OEB input to the input terminals IP4 and IP5 respectively. Accordingly, with the scanner 1 of the first embodiment, in each of the k image reading chips 415 included in the first image reading chip group, the drive capability of the output circuit 140 can be set appropriately such that the drive capability matches the size of the load of the transfer wire for the image signal SO (image signal SO1) and does not become excessive, and in each of the m-k image reading chips 415 included in the second image reading chip group, the drive capability of the output circuit 140 can be set appropriately such that the drive capability matches the size of the load of the transfer wire for the image signal SO (image signal SO2) and does not become excessive, and therefore it is possible to suppress the occurrence of excessive power consumption and excessive noise accompanying signal transfer.

Also, with the scanner 1 of the present first embodiment, the image signals SO (image signals SO1) output from the k image reading chips 415 included in the first image reading chip group are sequentially transferred to the analog front end (AFE) 202a and the image signals SO (image signals SO2) output from the m-k image reading chips 415 included in the second image reading chip group are sequentially transferred to the analog front end (AFE) 202b. Accordingly, with the scanner 1 of the first embodiment, transfer of the image signals SO (image signals SO1) output from the k image reading chips 415 included in the first image reading chip group and transfer of the image signals SO (image signals 302) output from the m-k image reading chips 415 included in the second image reading chip group are performed in parallel, and therefore it is possible to increase the speed of reading the image.

In particular, since the scanner 1 of the present embodiment is a sheet-feeding scanner in which the image sensor module 41 does not move, the image sensor module 41 can be fixed at a location that is relatively close to the main substrate 60. Accordingly, since the transfer wire for the image signals SO1 and the transfer wire for the image signals SO2 are short and the loads of the transfer wires are relatively small, the drive capabilities of the output circuits 140 of the image reading chips 415 are set to $\alpha_1$ or $\alpha_2$, which are relatively small, and as a result, it is possible to reduce power consumption and noise accompanying transfer of the image signals SO.

Also, since the scanner 1 of the first embodiment uses highly-versatile image reading chips 415 that can output the image signals SO with a drive capability selected from multiple drive capabilities, it is not necessary to design an image reading chip specialized for the scanner 1, and it is possible to reduce cost.

Also, with the scanner 1 of the present embodiment, during assembly, it is sufficient that the input terminals IP4 and IP5 of the image reading chips 415 are respectively connected to the voltage sources that output the fixed voltages VA1 and VB1 or the voltage sources that output the fixed voltages VA2 and VB2, and therefore the drive capabilities of the output circuits 140 of the image reading chips 415 can be set easily.

Note that in the present embodiment, with the image reading chip 415, the drive capability of the output circuit 140 can be selected from among three types, namely $\alpha_1$, $\alpha_2$, and $\alpha_3$, but it is also possible to select from two types, or from four or more types.

Also, the scanner 1 of the first embodiment may have a configuration in which the output control signals OEA and OEB with fixed voltages are supplied to only the k image reading chips 415 included in the first image reading chip group or the m-k image reading chips 415 included in the second image reading chip group.

2. Second Embodiment

Hereinafter, regarding a scanner 1 of a second embodiment, constituent elements similar to those of the first embodiment are denoted by the same reference numerals, description that is redundant with the first embodiment is not included, and mainly content that differs from that of the first embodiment will be described.

The structure of the scanner 1 of the second embodiment is similar to that of the first embodiment (FIGS. 1 to 4), and therefore illustration and description thereof is not included here. Also, the functional block diagram of the image reading chip 415 according to the second embodiment is similar to that of the first embodiment (FIG. 7), and therefore illustration and description thereof is not included here.

Figure 13:
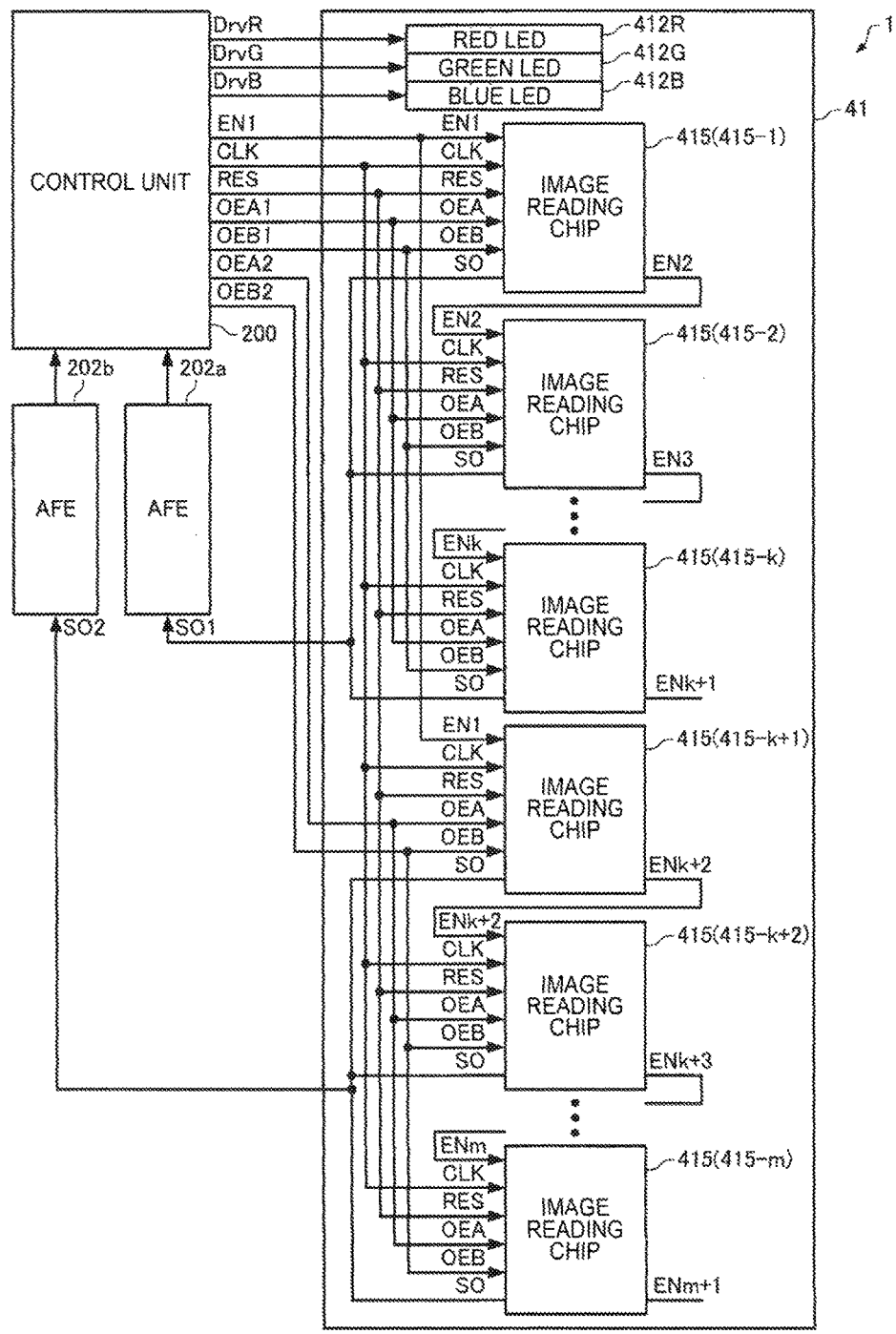
FIG. 13 is a diagram showing an example of a functional configuration of a scanner according to a second embodiment.

FIG. 13 is a functional block diagram showing an example of a functional configuration of the scanner 1 of the second embodiment. As shown in FIG. 13, the output control signals OEA and OEB (OEA1 and OEB1) input to the input terminals IP4 and IP5 of the k image reading chips 415 (415-1 to 415-k) included in the first image reading chip group and the output control signals OEA and OEB (OEA2 and OEB2) input to the input terminals IP4 and IP5 of the m-k image reading chips 415 (415-k+1 to 415-m) included in the second image reading chip group are transferred from the control unit 200. For example, the control unit 200 supplies the output control signal OEA1 with the fixed voltage VA1 as the output control signal OEA to the input terminals IP4 of the k image reading chips 415 included in the first image reading chip group, and supplies the output control signal OEB1 with the fixed voltage VB1 as the output control signal OEB to the input terminals IP5. Also, the control unit 200 supplies the output control signal OEA2 with the fixed voltage VA2 as the output control signal OEA to the input terminals IP4 of the m-k image reading chips 415 included in the second image reading chip group, and supplies the output control signal OEB2 with the fixed voltage VB2 as the output control signal OEB to the input terminals IP5.

Similarly to the first embodiment, with the image reading chip 415, the output selection unit 150 decodes the output control signals OEA and OEB input from the input terminals IP4 and IP5 in accordance with the decoding logic shown in FIG. 12 for example, generates the drive capability selection signals OE1 and OE2, and supplies them to the output circuit 140. Also, similarly to the first embodiment, the output circuit 140 is a circuit with the configuration shown in FIG. 10 or 11, for example, and outputs the image signal SO with one of the drive capabilities $\alpha_1$, $\alpha_2$, and $\alpha_3$ according to the voltage levels of the drive capability selection signals OE1 and OE2.

According to the above-described scanner 1 of the second embodiment, an effect similar to that of the first embodiment is exhibited. Furthermore, with the scanner 1 of the second embodiment, the drive capability of the output circuits 140 of the k image reading chips 415 included in the first image reading chip group is selected based on the output control signals OEA1 and OEB1 transferred from the control unit 200, and the drive capability of the output circuits 140 of the m-k image reading chips 415 included in the second image reading chip group is selected based on the output control signals OEA2 and OEB2 transferred from the control unit 200. Accordingly, with the scanner 1 of the second embodiment, after the scanner 1 is assembled, the drive capabilities of the output circuits 140 can be changed according to a change in the load of the transfer wire for the image signals SO1 and a change in the load of the transfer wire for the image signals SO2, and it is possible to effectively suppress the occurrence of excessive power consumption and excessive noise accompanying signal transfer.

Note that the scanner 1 of the second embodiment may have a configuration in which the control unit 200 supplies the output control signals OEA and OEB to only the k image reading chips 415 included in the first image reading chip group or the m-k image reading chips 415 included in the second image reading chip group. For example, the scanner 1 of the second embodiment may have a configuration in which the control unit 200 supplies the output control signals OEA2 and OEB2 to the input terminals IP4 and IP5 of the k image reading chips 415 included in the first image reading chip group and the input terminals IP4 and IP5 of the m-k image reading chips 415 included in the second image reading chip group are electrically connected to voltage sources (not shown) that output fixed voltages. Also, for example, the scanner 1 of the second embodiment may have a configuration in which the control unit 200 supplies the output control signals OEA2 and OEB2 to the input terminals IP4 and IP5 of the m-k image reading chips 415 included in the second image reading chip group and the input terminals IP4 and IP5 of the k image reading chips 415 included in the first image reading chip group are electrically connected to voltage sources (not shown) that output fixed voltages.

3. Third Embodiment

Hereinafter, regarding a scanner 1 of a third embodiment, constituent elements similar to those of the first embodiment or the second embodiment are denoted by the same reference numerals, description that is redundant with the first embodiment or the second embodiment is not included, and mainly content that differs from that of the first embodiment and the second embodiment will be described.

The structure of the scanner 1 of the third embodiment is similar to that of the first embodiment (FIGS. 1 to 4), and therefore illustration and description thereof is not included.

Figure 14:
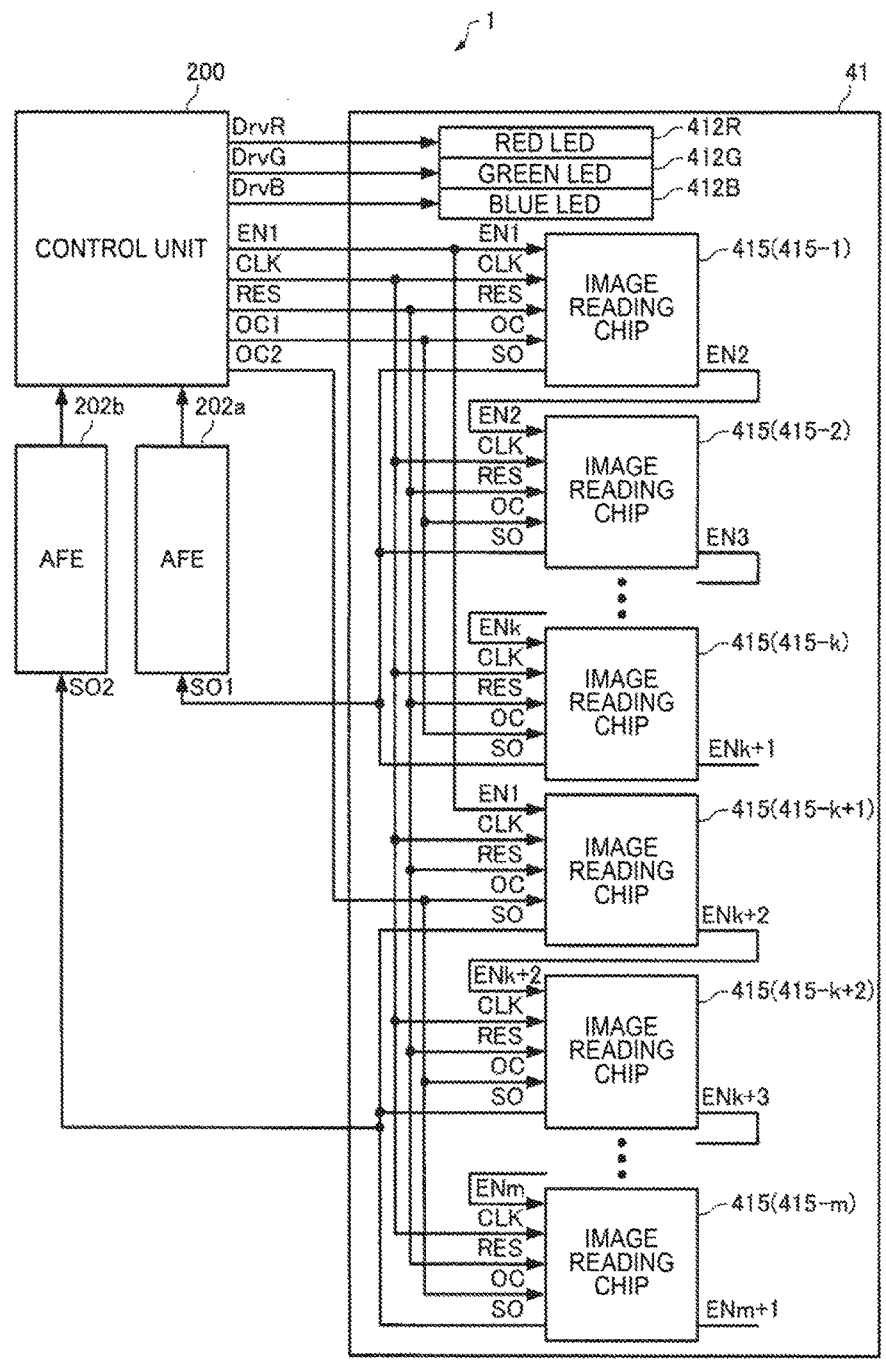
FIG. 14 is a diagram showing an example of a functional configuration of a scanner according to a third embodiment.
Figure 15:
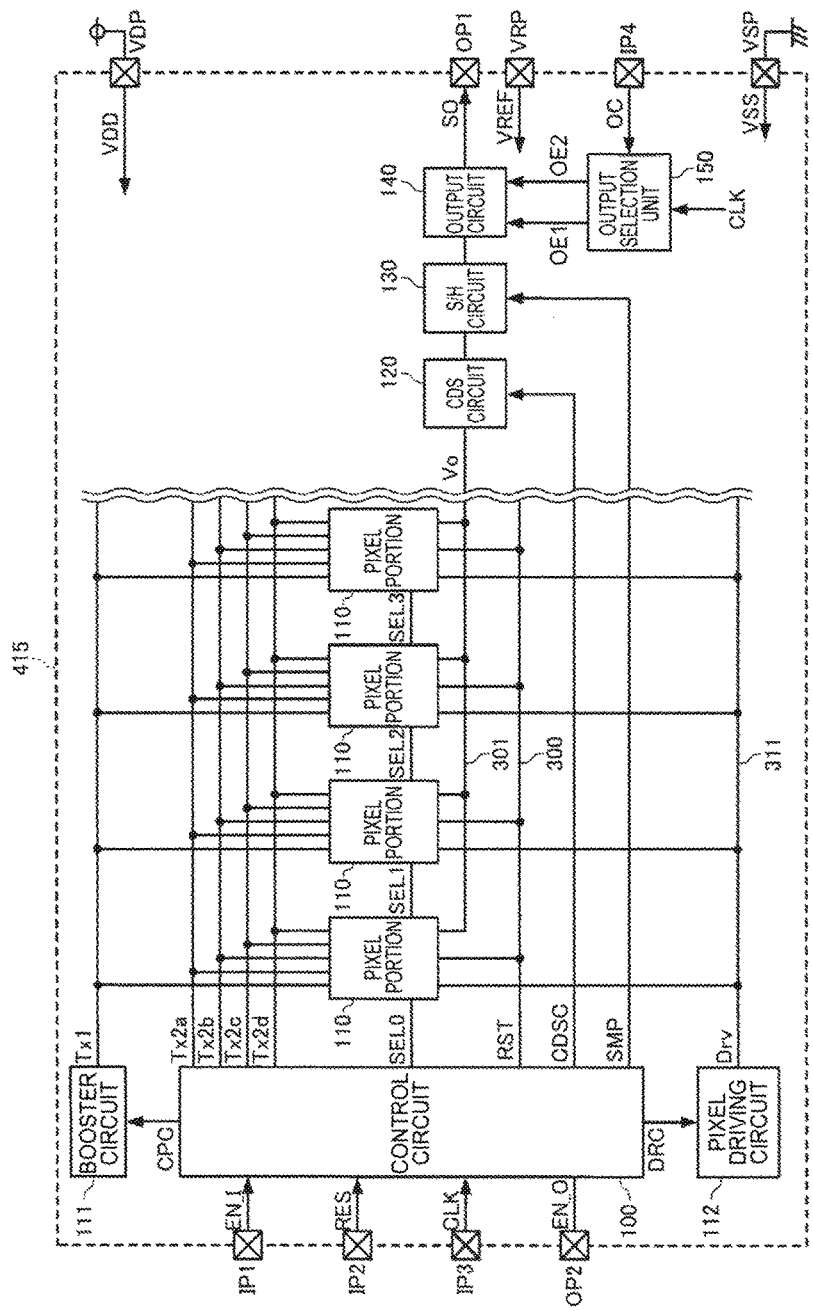
FIG. 15 is a functional block diagram of an image reading chip according to the third embodiment.

FIG. 14 is a functional block diagram showing an example of a functional configuration of the scanner 1 of the third embodiment. Also, FIG. 15 is a functional block diagram of an image reading chip 415. As shown in FIG. 14, in the scanner 1 of the third embodiment, the control unit 200 supplies an output control signal OC1 as an output control signal OC, which is a serial signal, to all of the k image reading chips 415 (415-1 to 415-k) included in the first image reading chip group. Also, the control unit 200 supplies an output control signal OC2 as an output control signal OC, which is a serial signal, to all of the m-k image reading chips 415 (415-k+1 to 415-m) included in the second image reading chip group. The output control signal OC is a signal for setting the drive capability of the output circuit 140 that outputs the image signal SO in an image reading chip 415.

Here, the output control signal OC, which is a serial signal, is supplied to the input terminals IP4 of the m image reading chips 415, and the image signals SO can be output with one of multiple drive capabilities selected based on the output control signal OC. In the present embodiment, in the k image reading chips 415 included in the first image reading chip group, the output control signal OC (output control signal OC1) input to the input terminals IP4 is transferred from the control unit 200. Similarly, in the m-k image reading chips 415 included in the second image reading chip group, the output control signal OC (output control signal OC2) input to the input terminals IP4 is transferred from the control unit 200.

Also, in the present embodiment, in the image reading chip 415, the output selection unit 150 selects the drive capability of the output circuit 140 from among multiple drive capabilities based on the output control signal OC input through the input terminal IP4. Specifically, the output selection unit 150 samples the output control signal OC input through the input terminal IP4 based on the clock signal CLK, and if one of multiple pre-determined patterns is detected, the output selection unit 150 generates the drive capability selection signals OE1 and OE2 that are associated with the detected pattern and supplies them to the output circuit 140.

Figure 16:
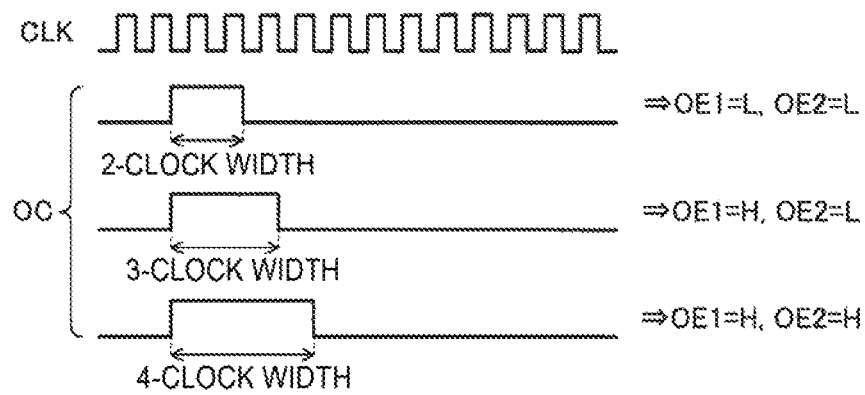
FIG. 16 is a diagram showing an example of a correspondence relationship between a pattern of an output control signal and a drive capability selection signal.

FIG. 16 shows an example of a correspondence relationship between the patterns of the output control signal OC and the drive capability selection signals OE1 and OE2. In the example shown in FIG. 16, if the number of rising edges of the clock signal CLK in the period during which the output control signal OC is at the high level is 2, the drive capability selection signals OE1 and OE2 are both at the low level. Accordingly, in this case, the drive capability of the output circuit 140 shown in FIG. 10 or 11 is $\alpha_1$. Also, if the number of rising edges of the clock signal CLK in the period during which the output control signal OC is at the high level is 3, the drive capability selection signal OE1 is at the high level and the drive capability selection signal OE2 is at the low level. Accordingly, in this case, the drive capability of the output circuit 140 shown in FIG. 10 or 11 is $\alpha_2$. Also, if the number of rising edges of the clock signal CLK in the period during which the output control signal OC is at the high level is 4, the drive capability selection signals OE1 and OE2 are both at the high level. Accordingly, in this case, the drive capability of the output circuit 140 shown in FIG. 10 or 11 is $\alpha_3$.

As described above, according to the scanner 1 of the third embodiment, an effect similar to that of the first embodiment is exhibited. Furthermore, according to the scanner 1 of the third embodiment, the image reading chip 415 selects the drive capability of the output circuit 140 based on the output control signal OC, which is a serial signal, and therefore it is sufficient to provide one terminal (input terminal IP4) as the terminal to which the signal for setting the drive capability of the output circuit 140 is supplied, and there is no need to provide multiple terminals (the input terminals IP4 and IP5 of the first embodiment or the second embodiment). Accordingly, this is advantageous for reducing the size and lowering the cost of the image reading chip 415.

Note that the scanner 1 of the third embodiment may have a configuration in which the control unit 200 supplies the output control signal OC to only the k image reading chips 415 included in the first image reading chip group or the m-k image reading chips 415 included in the second image reading chip group.

4. Fourth Embodiment

Hereinafter, regarding the scanner 1 of the fourth embodiment, constituent elements that are the same as those of the first embodiment, the second embodiment, and the third embodiment are denoted by the same reference numerals, description that is redundant with that of the first embodiment, second embodiment, and third embodiment is not included here, and mainly content that differs from that of the first embodiment, second embodiment, and third embodiment will be described.

The structure of the scanner 1 of the fourth embodiment is similar to that of the first embodiment (FIGS. 1 to 4), and therefore illustration and description thereof is not included here.

Figure 17:
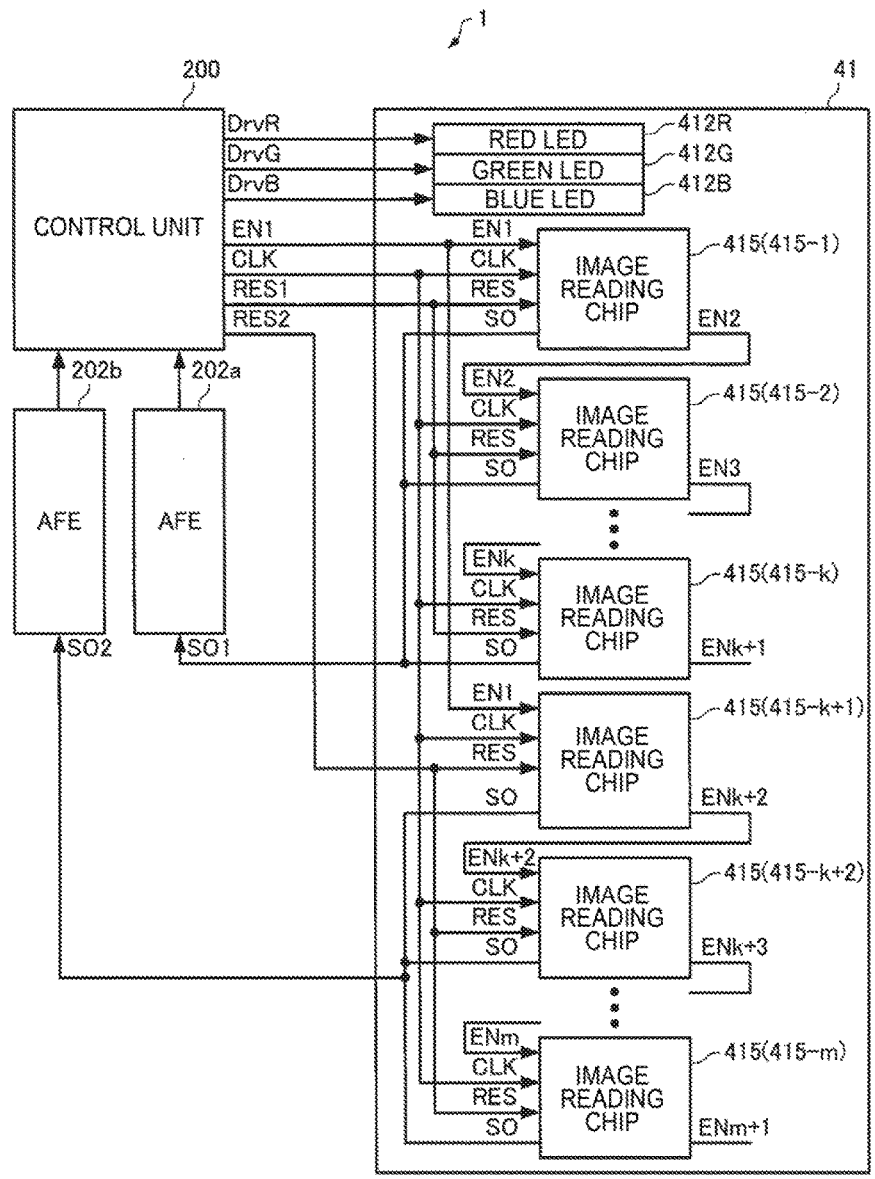
FIG. 17 is a diagram showing an example of a functional configuration of a scanner according to a fourth embodiment.
Figure 18:
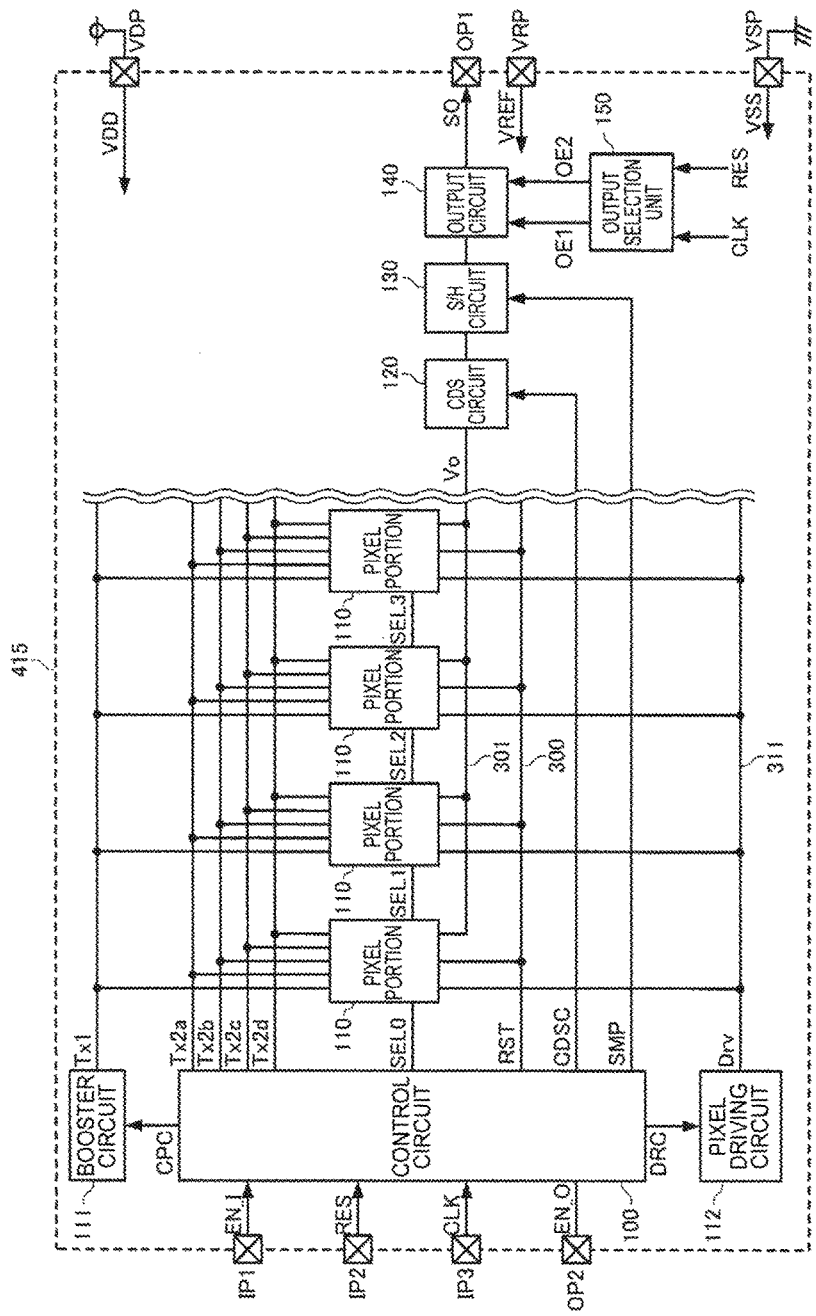
FIG. 18 is a functional block diagram of an image reading chip according to the fourth embodiment.

FIG. 17 is a functional block diagram showing an example of a functional configuration of the scanner 1 of the fourth embodiment. Also, FIG. 18 is a functional block diagram of the image reading chip 415 of the fourth embodiment. As shown in FIGS. 17 and 18, in the scanner 1 of the fourth embodiment, the resolution setting signal RES input to the input terminals IP2 of the m image reading chips 415 (415-1 to 415-m) is also used as a signal for setting the drive capability of the output circuits 140. In other words, in the fourth embodiment, the resolution setting signal RES is a signal for setting the drive capability of the output circuits 140 and for setting the resolution for image reading performed by the image reading chip 415. Specifically, with the scanner 1 of the fourth embodiment, the control unit 200 supplies the resolution setting signal RES1 as the resolution setting signal RES, which is a serial signal, to all of the k image reading chips 415 included in the first image reading chip group. Also, the control unit 200 supplies the resolution setting signal RES2 as the resolution setting signal RES, which is a serial signal, to all of the m-k image reading chips 415 included in the second image reading chip group.

Then, in the image reading chip 415, the output selection unit 150 selects the drive capability of the output circuit 140 from multiple drive capabilities based on the resolution setting signal RES. Specifically, if the resolution setting signal RES is sampled based on the clock signal CLK and one of multiple pre-determined patterns is detected, the output selection unit 150 generates the drive capability selection signals OE1 and OE2 associated with the detected pattern and supplies them to the output circuit 140.

Figure 19:
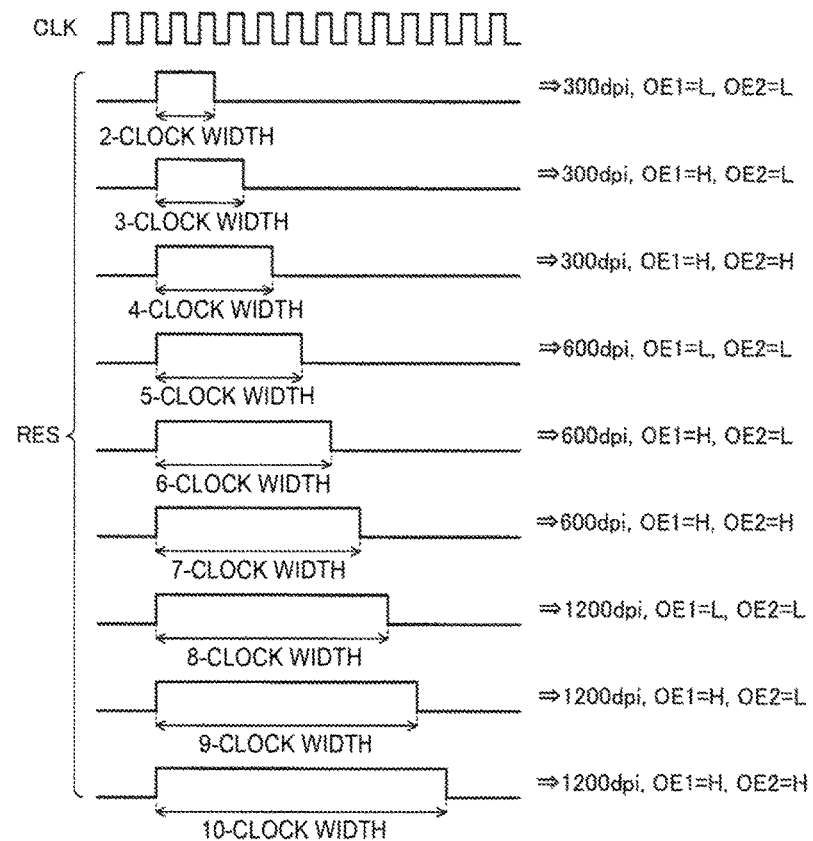
FIG. 19 is a diagram showing an example of a resolution setting signal according to the fourth embodiment.

FIG. 19 is a diagram showing an example of a correspondence relationship between the pattern of the resolution setting signal RES of the fourth embodiment, the resolution, and the drive capability selection signals OE1 and OE2. In the example shown in FIG. 19, if the number of rising edges of the clock signal CLK in the period during which the resolution setting signal RES is at the high level is 2, the resolution is set to 300 dpi and the drive capability selection signals OE1 and OE2 are both at the low level. Accordingly, in this case, the drive capability of the output circuit 140 shown in FIG. 10 or 11 is $\alpha_1$. Also, if the number of rising edges of the clock signal CLK in the period during which the resolution setting signal RES is at the high level is 3, the resolution is set to 300 dpi, the drive capability selection signal OE1 is at the high level, and the drive capability selection signal OE2 is at the low level. Accordingly, in this case, the drive capability of the output circuit 140 shown in FIG. 10 or 11 is $\alpha_2$. Also, if the number of rising edges of the clock signal CLK in the period during which the resolution setting signal RES is at the high level is 4, the resolution is set to 300 dpi, the drive capability selection signals OE1 and OE2 are both at the high level. Accordingly, in this case, the drive capability of the output circuit 140 shown in FIG. 10 or 11 is $\alpha_3$.

Also, if the number of rising edges of the clock signal CLK in the period during which the resolution setting signal RES is at the high level is 5, the resolution is set to 600 dpi, and the drive capability selection signals OE1 and OE2 are both at the low level. Accordingly, in this case, the drive capability of the output circuit 140 shown in FIG. 10 or 11 is $\alpha_1$. Also, if the number of rising edges of the clock signal CLK in the period during which the resolution setting signal RES is at the high level is 6, the resolution is set to 600 dpi, the drive capability selection signal OE1 is at the high level, and the drive capability selection signal OE2 is at the low level. Accordingly, in this case, the drive capability of the output circuit 140 shown in FIG. 10 or 11 is $\alpha_2$. Also, if the number of rising edges of the clock signal CLK in the period during which the resolution setting signal RES is at the high level is 7, the resolution is set to 600 dpi, the drive capability selection signals OE1 and OE2 are both at the high level. Accordingly, in this case, the drive capability of the output circuit 140 shown in FIG. 10 or 11 is $\alpha_3$.

Also, if the number of rising edges of the clock signal CLK in the period during which the resolution setting signal RES is at the high level is 8, the resolution is set to 1200 dpi, and the drive capability selection signals OE1 and OE2 are both at the low level. Accordingly, in this case, the drive capability of the output circuit 140 shown in FIG. 10 or 11 is $\alpha_1$. Also, if the number of rising edges of the clock signal CLK in the period during which the resolution setting signal RES is at the high level is 9, the resolution is set to 1200 dpi, the drive capability selection signal OE1 is at the high level, and the drive capability selection signal OE2 is at the low level. Accordingly, in this case, the drive capability of the output circuit 140 shown in FIG. 10 or 11 is $\alpha_2$. Also, if the number of rising edges of the clock signal CLK in the period during which the resolution setting signal RES is at the high level is 10, the resolution is set to 1200 dpi, and the drive capability selection signals OE1 and OE2 are both at the high level. Accordingly, in this case, the drive capability of the output circuit 140 shown in FIG. 10 or 11 is $\alpha_3$.

According to the above-described scanner 1 of the fourth embodiment, an effect similar to that of the first embodiment is exhibited. Furthermore, with the scanner 1 of the fourth embodiment, the signal for setting the drive capability of the output circuit 140 of the image reading chip 415 can also be used as a signal for setting the resolution of image reading performed by the image reading chip 415, and therefore a dedicated terminal (the terminal IP4 in the first embodiment) to which the signal for setting the drive capability of the output circuit is supplied is not needed in the image reading chip 415. Accordingly, this is advantageous for reducing the size and lowering the cost of the image reading chip 415.

Note that the scanner 1 of the fourth embodiment may have a configuration in which the control unit 200 transfers the resolution setting signal RES for setting the drive capability of the output circuit 140 to only the k image reading chips 415 included in the first image reading chip group or the m-k image reading chips 415 included in the second image reading chip group.

5. Fifth Embodiment

Figure 20:
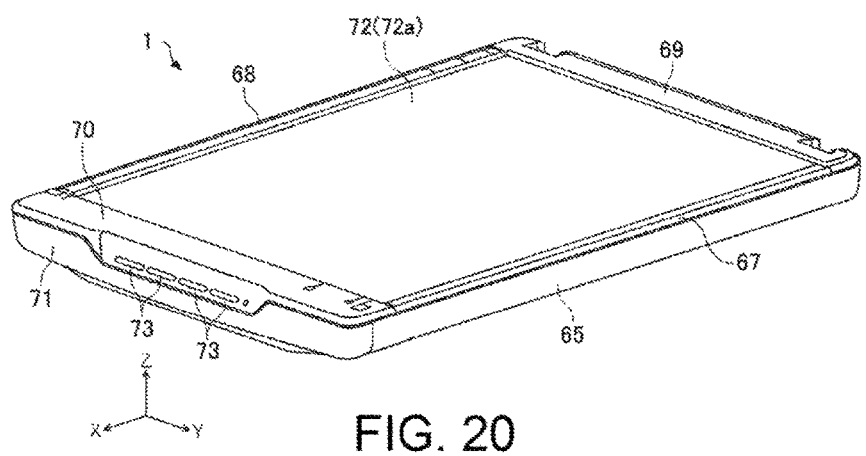
FIG. 20 is a perspective view illustrating an exterior of a scanner according to a fifth embodiment.
Figure 21:
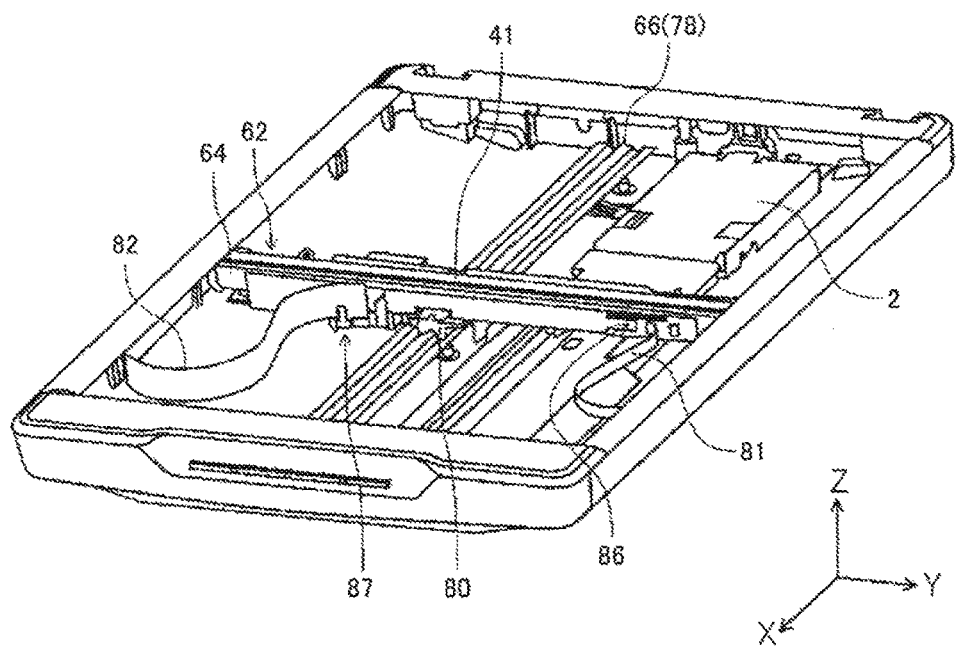
FIG. 21 is a perspective view showing an inner portion of the scanner according to the fifth embodiment.

FIG. 20 is a perspective view illustrating an exterior of the scanner 1 (image reading apparatus) of the fifth embodiment. FIG. 21 is a perspective view showing the interior of the scanner 1. In the X-Y-Z coordinate system shown in the drawings, the X direction and the Y direction are horizontal directions, and among these, the X direction is the scanning direction of an image reading unit 62 and is the depth direction of the scanner 1. Also, the Y direction is the extension direction of the image reading unit 62 and is the width direction of the scanner 1. The Z direction is the gravity direction and is the height direction of the scanner 1. Note that in the drawings, the +Z direction is on the upper surface side of the scanner 1, and the −Z direction side is on the lower surface side of the scanner 1.

As shown in FIG. 20, the scanner 1 of the fifth embodiment includes an original document platen glass 72, the upper surface of the original document platen glass 72 forms an original document mounting surface 72a on which an original document (an example of a medium on which an image is formed) is mounted. In the present embodiment, the original document platen glass 72 is a transparent glass plate. The periphery of the original document platen glass 72 is constituted by multiple frames, and the rectangular region demarcated by these frames is the original document reading region (original document mounting surface 72a) in which reading can be performed by the image reading unit 62 (see FIG. 21).

Note that the scanner 1 includes a cover that can open and close (not shown), and this cover is constituted so as to open and close the original document mounting surface 72a. Also, the cover is provided with an original document pressing mat (not shown) that is formed of an elastic material (e.g., sponge), and when the cover is closed, the original document mounted on the original document mounting surface 72a is pressed by the original document pressing mat and the surface to be read is brought into close contact with the original document mounting surface 72a.

The frame demarcating the original document mounting surface 72a is constituted by a right upper frame 67, a left upper frame 68, a rear frame 69, and an upper front frame 70. These frames are attached to the housing 65. Note that a lower front frame 71 is attached to the housing 65 below the upper front frame 70. Reference numeral 73 indicates operation buttons for operating the scanner 1. The above-described frames and housing 65 are all formed of a resin material, for example.

The housing 65 forms a box shape, and as shown in FIG. 21, the housing 65 is provided with the image reading unit 62.

The image reading unit 62 is constituted by an image sensor module 41 and a carriage 64 for holding the image sensor module 41. The image sensor module 41 is held in a state of being biased in the +X direction in the carriage 64 by a biasing member (not shown) attached to the carriage 64.

The image sensor module 41 emits light to the original document mounted on the original document mounting surface 72a, receives the reflected light from the original document (light from the image) and generates an image signal based on the signal obtained through photoelectric conversion, whereby the information (image) of the original document is read. Similarly to the first embodiment to the fourth embodiment, the image sensor module 41 is a CMOS line sensor of a CIS type, for example, and since the structure and function thereof were described in the first embodiment, they will not be described here.

The carriage 64 moveably engages with a guide portion 66, includes a motor (not shown) that serves as a driving source that causes the carriage 64 to move on the lower surface, and the carriage 64 is configured to be guided by the guide portion 66 and move in the X axis direction due to the driving force of the motor. The carriage 64 is provided with an engaging member 80 that slidably engages with a protruding portion 78 on the guide portion 66 side.

One end of a flexible flat cable 81 is connected to the motor provided on the lower surface side of the carriage 64. The other end of the flexible flat cable 81 is connected to a power supplying source (not shown), and power is supplied from the power supplying source to the motor via the flexible flat cable 81. The flexible flat cable 81 is drawn out from the lower surface side of the carriage 64 and is fixed at a predetermined position of the carriage 64, such as a position 86 on the wall surface on the +X direction side of the carriage 64, and is thereafter drawn around inside the housing 65. Also, the flexible flat cable 81 has a curved portion, and is thus configured to be able to deform following movement of the carriage 64, or in other words, movement of the image reading unit 62.

Also, the image sensor module 41 includes a module substrate 414 (see FIGS. 3 and 4) on which the multiple (m) image reading chips 415 are mounted, and the flexible flat cable 82 is connected to the module substrate 414. Various types of signals from the processing unit 2 including the control unit 200 and the analog front ends (AFEs) 202a and 202b (see FIG. 5) are transferred to the image reading chips 415 via the flexible flat cable 82. Also, the image signal SO from the image reading chip 415 is transferred to the processing unit 2 via the flexible flat cable 82. The flexible flat cable 82 is drawn out from the lower surface side of the image sensor module 41 and is fixed on the wall surface on the +X direction side of the carriage 64. The location at which the flexible flat cable 82 is fixed to the carriage 64 is indicated by reference numeral 87. Similarly to the flexible flat cable 81, the flexible flat cable 82 also has bent portions, and thus is configured to be able to deform following the movement of the carriage 64, or in other words, the movement of the image reading unit 62.

The carriage 64 and a motor (not shown), which is the driving source of the carriage 64, form a movement portion that moves the image reading unit 62 (the image sensor module 41 including the image reading chips 415), and the scanner 1 of the fifth embodiment is a so-called flat-bed scanner. Accordingly, since a flexible flat cable 82 of a length corresponding to the movement distance of the image sensor module 41 is needed, the load of the wire by which the image signals SO (image signals SO1) are transferred from the k image reading chips 415 included in the first image reading chip group to the analog front end (AFE) 202a and the load of the wire by which the image signals SO (image signals SO2) are transferred from the m-k image reading chips 415 included in the second image reading chip group to the analog front end (AFE) 202b depend on the length of the flexible flat cable 82.

For example, if assembly is performed such that the flexible flat cable 82 is relatively short, the wire load is relatively small, and therefore the drive capability of the output circuits 140 of them image reading chips 415 can be set to $\alpha_1$ or $\alpha_2$ and need not be set to the largest drive capability $\alpha_3$. In other words, in each of the m image reading chips 415, the output selection unit 150 may select the drive capability $\alpha_1$ or $\alpha_2$ as the drive capability of the output circuit 140. Furthermore, if the number m-k of the image reading chips 415 included in the second image reading chip group is greater than the number k of the image reading chips 415 included in the first image reading chip group, the output selection units 150 of the k image reading chips 415 included in the first image reading chip group may select the drive capability $\alpha_1$ as the drive capability of the output circuits 140, and the output selection units 150 of the m-k image reading chips 415 included in the second image reading chip group may select $\alpha_2$ as the drive capability of the output circuits 140.

Also, for example, if assembly is performed such that the flexible flat cable 82 is relatively long, the wire load is relatively large, and therefore the drive capability of the output circuits 140 of them image reading chips 415 can be set to $\alpha_2$ or $\alpha_3$. In other words, in each of the m image reading chips 415, the output selection unit 150 may select the drive capability $\alpha_2$ or $\alpha_3$ as the drive capability of the output circuit 140. Furthermore, if the number m-k of the image reading chips 415 included in the second image reading chip group is greater than the number k of the image reading chips 415 included in the first image reading chip group, the output selection units 150 of the k image reading chips 415 included in the first image reading chip group may select the drive capability $\alpha_2$ as the drive capability of the output circuits 140, and the output selection units 150 of the m-k image reading chips 415 included in the second image reading chip group may select $\alpha_3$ as the drive capability of the output circuits 140.

Also, for example, if assembly is performed such that the flexible flat cable 82 is extremely long, the wire load is extremely large, and therefore the drive capability of the output circuits 140 of them image reading chips 415 may be set to the largest drive capability $\alpha_3$. In other words, in each of the m image reading chips 415, the output selection unit 150 may select the largest drive capability $\alpha_3$ as the drive capability of the output circuit 140.

Also, the configuration of the image sensor module 41 according to the fifth embodiment is similar to that of the first embodiment (FIGS. 3 and 4), and therefore illustration and description thereof are not included here. Also, an example of the functional configuration of the scanner of the fifth embodiment is similar to that of the first embodiment (FIG. 5), the second embodiment (FIG. 13), the third embodiment (FIG. 14), or the fourth embodiment (FIG. 17), and therefore illustration and description thereof are not included here. Also, the functional block diagram of the image reading chip 415 according to the fifth embodiment is similar to that of the first embodiment (FIG. 7), the third embodiment (FIG. 15), or the fourth embodiment (FIG. 18), and therefore illustration and description thereof is not included.

According to the above-described scanner 1 of the fifth embodiment, an effect similar to that of the first embodiment is exhibited. Furthermore, the scanner 1 of the fifth embodiment is a flat-bed scanner in which the image sensor module 41, which includes the image reading chips 415, moves, and therefore the flexible flat cable 82 for transferring the image signals SO is needed, and the wire load is relatively larger. Accordingly, with the scanner 1 of the fifth embodiment, for example, by setting the drive capability of the output circuits 140 to $\alpha_2$ or $\alpha_3$, which are relatively large, in at least the k image reading chips 415 constituting the first image reading chip group or the m-k image reading chips 415 constituting the second image reading chip group, it is possible to reliably transfer the image signals SO while suppressing the occurrence of excessive power consumption and excessive noise accompanying signal transfer.

Although embodiments were described above, the invention is not limited to these embodiments, and can be carried out in various forms without departing from the gist of the invention. For example, the above-described embodiments can also be used in combination as appropriate.

The invention encompasses configurations that are substantially the same as the configurations described in the present embodiment (e.g., configurations with the same functions, methods, and results, or configurations with the same object and effect). Also, the invention encompasses a configuration obtained by replacing a non-essential portion of the configuration described in the embodiments. Also, the invention encompasses configurations that exhibit the same effect as the configuration described in the embodiment and configurations that can achieve the same object. Also, the invention encompasses a configuration obtained by adding a known technique to the configuration described in the embodiments.

This application claims priority from Japanese Patent Application No. 2016-190809 filed in the Japanese Patent Office on Sep. 29, 2016, the entire disclosure of which is hereby incorporated by reference in its entirely.

What is claimed is:

1. An image reading apparatus comprising:
an image sensor module that includes a first image reading chip and a second image reading chip and is configured to read an image;
a first reception circuit; and
a second reception circuit,
wherein the first image reading chip includes:
a first pixel circuit that is configured to output a first pixel signal and includes a first light-receiving element that receives and photoelectrically converts light from the image;
a first output circuit that can output a signal based on the first pixel signal with one of a plurality of drive capabilities including a first drive capability and a second drive capability that is larger than the first drive capability; and
a first output selection circuit configured to select a drive capability of the first output circuit from the plurality of drive capabilities,
the second image reading chip includes:
a second pixel circuit that is configured to output a second pixel signal and includes a second light-receiving element that receives and photoelectrically converts light from the image;
a second output circuit that can output a signal based on the second pixel signal with one of a plurality of drive capabilities including a third drive capability; and
a second output selection circuit configured to select a drive capability of the second output circuit from the plurality of drive capabilities,
the first reception circuit receives the signal output from the first output circuit,
the second reception circuit receives the signal output from the second output circuit, and
the output selection circuit selects the first drive capability.

2. The image reading apparatus according to claim 1, wherein
the plurality of drive capabilities of the second output circuit include a fourth drive capability that is larger than the third drive capability, and
the second output selection circuit selects the third drive capability.

3. The image reading apparatus according to claim 1, wherein
the image sensor module includes:
a first image reading chip group comprising a plurality of image reading chips including the first image reading chip; and
a second image reading chip group comprising a plurality of image reading chips including the second image reading chip,
the plurality of image reading chips included in the first image reading chip group each include:
the first pixel circuit;
the first output circuit; and
the first output selection circuit,
the plurality of image reading chips included in the second image reading chip group each include:
the second pixel circuit;
the second output circuit; and
the second output selection circuit,
the first reception circuit sequentially receives signals output from the first output circuits of the plurality of image reading chips included in the first image reading chip group, and
the second reception circuit sequentially receives signals output from the second output circuits of the plurality of image reading chips included in the second image reading chip group.

4. The image reading apparatus according to claim 3, wherein
the first output selection circuits of the plurality of image reading chips included in the first image reading chip group select the first drive capability, and
the second output selection circuits of the plurality of image reading chips included in the second image reading chip group select the third drive capability.

5. The image reading apparatus according to claim 4, wherein
the number of the image reading chips included in the second image reading chip group is larger than the number of the image reading chips included in the first image reading chip group, and
the third drive capability is larger than the first drive capability.

6. The image reading apparatus according to claim 1, wherein
the first image reading chip includes a first terminal,
the first output selection circuit selects the drive capability of the first output circuit based on a signal input to the first terminal,
the second image reading chip includes a second terminal, and
the second output selection circuit selects the drive capability of the second output circuit based on a signal input to the second terminal.

7. The image reading apparatus according to claim 6, further comprising
a control circuit configured to control an operation of the image sensor module,
wherein at least one of the signal input to the first terminal and the signal input to the second terminal is transferred from the control circuit.

8. The image reading apparatus according to claim 6, wherein
at least one of the signal input to the first terminal and the signal input to the second terminal is a signal for setting the drive capability and for setting a resolution for reading the image.

9. The image reading apparatus according to claim 6, wherein
at least one of the first terminal and the second terminal is electrically connected to a voltage source that outputs a fixed voltage.

10. The image reading apparatus according to claim 1, wherein
the first image reading chip and the second image reading chip are chips of the same type.

11. An image sensor module comprising:
a first image reading chip;
a second image reading chip;
a third terminal; and
a fourth terminal,
wherein the first image reading chip includes:
a first pixel circuit that is configured to output a first pixel signal and includes a first light-receiving element that receives and photoelectrically converts light from an image;
a first output circuit that can output a signal based on the first pixel signal with one of a plurality of drive capabilities including a first drive capability and a second drive capability that is larger than the first drive capability; and
a first output selection circuit configured to select a drive capability of the first output circuit from the plurality of drive capabilities,
the second image reading chip includes:
a second pixel circuit that is configured to output a second pixel signal and includes a second light-receiving element that receives and photoelectrically converts light from the image;
a second output circuit that can output a signal based on the second pixel signal with one of a plurality of drive capabilities including a third drive capability; and
a second output selection circuit configured to select a drive capability of the second output circuit from the plurality of drive capabilities,
the signal output from the first output circuit is output from the third terminal,
the signal output from the second output circuit is output from the fourth terminal, and
the first output selection circuit selects the first drive capability.

* * * * *